US010422950B2

(12) United States Patent
Sutherland

(10) Patent No.: US 10,422,950 B2
(45) Date of Patent: Sep. 24, 2019

(54) LAMINATED GLASS BEND OPTICAL INTERCONNECTION APPARATUS AND METHODS

(71) Applicant: CORNING OPTICAL COMMUNICATIONS LLC, Hickory, NC (US)

(72) Inventor: James Scott Sutherland, Corning, NY (US)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 15/890,607

(22) Filed: Feb. 7, 2018

(65) Prior Publication Data

US 2018/0239086 A1    Aug. 23, 2018

Related U.S. Application Data

(60) Provisional application No. 62/460,921, filed on Feb. 20, 2017.

(51) Int. Cl.
*G02B 6/36* (2006.01)
*G02B 6/12* (2006.01)
(Continued)

(52) U.S. Cl.
CPC ......... *G02B 6/12004* (2013.01); *G02B 6/102* (2013.01); *G02B 6/125* (2013.01);
(Continued)

(58) Field of Classification Search
CPC .. G02B 6/3893; G02B 6/3887; G02B 6/3825; G02B 6/3897; G02B 6/4292; G02B 6/36
See application file for complete search history.

(56) References Cited

U.S. PATENT DOCUMENTS 5,155,785 A   10/1992  Holland et al.
6,402,389 B1   6/2002  Steijer et al.
(Continued)

FOREIGN PATENT DOCUMENTS

DE   102012110903 A1   5/2014
JP   2008020766 A      1/2008
JP   2013160869 A      8/2013

OTHER PUBLICATIONS

Berglund et al; "Application of V-Groove Technology for Small Form Factor Connector and Transceiver Modules"; 1999 Electronic Components and Technology Conference; pp. 392-397.
(Continued)

*Primary Examiner* — Jennifer Doan
(74) *Attorney, Agent, or Firm* — Adam R. Weeks

(57) ABSTRACT

The optical interconnection apparatus includes a laminated structure having an inner glass sheet, an adhesive layer, and an outer glass sheet. The laminated structure has a first bend section with bend angle and front and back opposite ends. An optical fiber is operably supported by the laminated structure so that it has a second bend section that follows the first bend section. The front end of the optical fiber resides proximate to the front end of the laminated structure and the back end of the optical fiber resides proximate to the back end of the laminated structure. The first bend section is formed by bending the laminated structure and then curing the adhesive. A protective coating can be deposited over the optical fiber and a portion of the laminated structure.

19 Claims, 25 Drawing Sheets

(51) Int. Cl.
| | |
|---|---|
| *G02B 6/38* | (2006.01) |
| *H01L 21/82* | (2006.01) |
| *G02B 6/42* | (2006.01) |
| *G02B 6/10* | (2006.01) |
| *G02B 6/13* | (2006.01) |
| *G02B 6/43* | (2006.01) |
| *G02B 6/125* | (2006.01) |

(52) U.S. Cl.
CPC .............. *G02B 6/13* (2013.01); *G02B 6/3652* (2013.01); *G02B 6/3809* (2013.01); *G02B 6/4214* (2013.01); *G02B 6/4257* (2013.01); *G02B 6/4259* (2013.01); *G02B 6/43* (2013.01); *H01L 21/82* (2013.01)

(56) References Cited

U.S. PATENT DOCUMENTS

| | | | |
|---|---|---|---|
| 7,428,364 | B2 | 9/2008 | Tourne |
| 7,665,911 | B2 | 2/2010 | Hamazaki |
| 7,680,365 | B2 | 3/2010 | Saito et al. |
| 7,802,927 | B2 | 9/2010 | Benjamin et al. |
| 8,014,644 | B2 | 9/2011 | Morimoto et al. |
| 8,442,368 | B1 * | 5/2013 | Reano ..................... G02B 6/136 385/29 |
| 9,442,249 | B2 * | 9/2016 | Yoshida .................. G02B 6/13 |
| 2004/0042754 | A1 | 3/2004 | Arima et al. |
| 2013/0322814 | A1 | 12/2013 | Lee |

OTHER PUBLICATIONS

Cho et al; "High-Coupling-Efficiency Optical Interconnection Using a 90°-Bent Fiber Array Connector in Optical Printed Circuit Boards"; IEEE Photonics Technology Letters, vol. 17, No. 3, Marcy 2005; pp. 690-692.

Hwang et al; "Optical Interconnection Platform Composed of Fiber-Embedded Board, 90°-Bent Fiber Block, and 10-GB/S Optical Module"; Journal of Lightwave Technology, vol. 26, No. 11, Jun. 1, 2008 pp. 1479-1485.

Hwang et al; "Two-Dimensional Optical Interconnection Based on Two-Layered Optical Printed Circuit Board"; IEEE Photonics Technology Letters, vol. 19, No. 6, Mar. 15, 2007; pp. 411-413.

Lee; "Glass Part 3: New Generation of Specialty Glass for LCDS and AMOLEDS"; Gases & Instrumentation; www.gasesmag.com; 6 pages; Date Unknown.

Suzuki et al; "Vertically Pluggable and Compact 10-GB/S X 12-Channel Optical Modules With Anisotropic Conductive Film for Over 100-GB/S Optical Interconnect Systems"; Journal of Lightwave Technology, vol. 27, No. 15, Aug. 1, 2009; pp. 3249-3258.

* cited by examiner

LAMINATED GLASS BEND OPTICAL INTERCONNECTION APPARATUS AND METHODS

PRIORITY APPLICATION

This application claims the benefit of U.S. Provisional Application No. 62/460,921, filed on Feb. 20, 2017, the content of which is relied upon and incorporated herein by reference in its entirety.

FIELD

The present disclosure relates to interconnections made between a photonic integrated circuit and another optical device, and in particular relates to a laminated glass bend optical interconnection apparatus and methods.

BACKGROUND

Photonic systems typically require optical connections to be made between a photonic integrated circuit (PIC) and another optical device, such as an optical-electrical (OE) printed circuit board. For example, optical signals traveling in optical waveguides of the OE printed circuit board typically need to be in optical communication with a photonic device in the form of a detector (e.g., light sensor) on the PIC.

In some cases, the optical connection can be formed using optical fibers. However, low-profile packaging requirements dictate the maximum allowable height (clearance) to which the optical fibers can reach. The optical fibers may also need to have nearly right-angle bends to accommodate vertical emitting or vertical detecting photonic devices.

The combination of low-profile packaging requirements and the need for strong bending present challenges to the use of optical fibers for optical interconnections within photonic systems. In particular, the long-term reliability of the optical fibers can be compromised by tensile and compressive stresses and strains imparted to the fiber. Further, the bending loss for strong bends put limits on the fiber diameter that can be used. In addition, precise alignment of the optical fibers to PIC devices such as light sources, detectors and optical waveguides presents additional challenges when fabricating photonic systems. For example, mismatches in the coefficients of thermal expansions of materials used in forming optical-fiber-based interconnectors can lead to misalignment and induced stresses when interfacing with silicon-based PICs.

SUMMARY

An embodiment of the disclosure is an optical interconnection apparatus that includes a laminated structure. The laminated structure includes an inner glass sheet, an adhesive layer, and an outer glass sheet. The laminated structure has a first bend section that defines a bend angle of between 80° and 90°. The laminated structure also has an inside surface, an outside surface and front and back opposite ends. The optical interconnection apparatus also has at least one optical fiber operably supported by the laminated structure so that the at least one optical fiber has a second bend section that follows the first bend section. The at least one optical fiber has a front end that resides proximate to the front end of the laminated structure and a back end that resides proximate to the back end of the laminated structure.

Another embodiment of the disclosure is a method of forming an optical interconnection apparatus. The method includes: a) forming a laminated structure having opposite front and back ends and comprising an uncured adhesive layer sandwiched by inner and outer glass sheets that respectively define inner and outer surfaces of the laminated structure; b) supporting at least one optical fiber at either the inner surface, the outer surface or within the adhesive layer of the laminated structure so that a front end of the optical fiber is proximate to the front end of the laminated structure and a back end of the optical fiber is proximate to the back end of the laminated structure; c) bending the laminated structure and the at least one optical fiber to form a first bend section in the laminated structure and a second bend section in the at least one optical fiber without substantially stretching the optical fiber, the first bend section defining a bend angle of between 80° and 90°; and d) curing the adhesive to fix the first bend section in the laminated structure.

In various examples, the at least one optical fiber is supported by either the outer surface of the laminated structure, the inner surface of the laminated structure or in the adhesive layer of the laminated structure. In an example, a protective coating is provided (e.g., deposited) over the at least one optical fiber and a portion of the laminated structure when it resides on the inner surface or the outer surface of the laminated structure.

In an example, the outer and inner glass sheets have respective thicknesses of $TH_A$ and $TH_B$, the adhesive layer has a thickness $TH_{AL}$, and the glass and adhesive thicknesses are in the respective ranges of 30 µm≤$TH_A$, $TH_B$≤80 µm and 200 µm≤$TH_{AL}$≤1000 µm.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 83 is similar to FIG. 8A and shows the sub-assembly being bent using the bending fixture and clamping apparatus;

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

The acronym PIC stands for photonic integrated circuit.

The acronym PCB stands for printed circuit board.

The acronym OE-PCB stands for optical-electrical printed circuit board, which is a type of printed circuit board that supports both electrical and optical components and that has both optical and electrical functionality.

In the discussion below, the term "micron" means micrometer, i.e., $1 \times 10^{-6}$ meter, which is abbreviated as "μm" in the art.

The term "optical interconnector" is used as herein an abbreviated alternative to the more formal term "optical interconnection apparatus" to simplify the discussion.

Glass Sheets for Forming the Optical Interconnector

Figure 1:
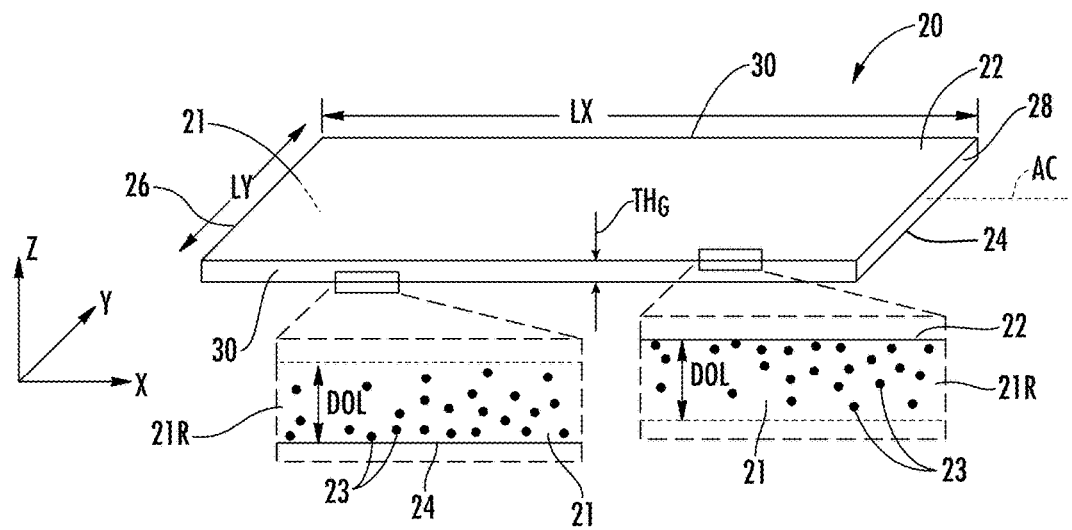
FIG. 1 is an elevated view of an example glass sheet as used to form the optical interconnection apparatus disclosed herein.

The optical interconnectors disclosed herein rely at least one flexible glass sheet that can be bent to have a small bend radius RB (e.g., 2.5 mm) while maintaining long-term reliability, e.g., it does not break or fracture. FIG. 1 is an elevated view of an example flexible glass sheet ("glass sheet") 20. The glass sheet 20 has a body 21 with a body (bulk) refractive index $n_b$, a top surface 22, a bottom surface 24, a front end 26, a back end 28 and opposite sides 30. The glass sheet 20 also has a thickness $TH_G$, and dimensions LX and LY in the x-direction and y-direction, respectively. In an example, the thickness $TH_G$ is between 50 microns and 100 microns. The dimensions LX and LY represent the "length" and the "width" of the glass sheet. The glass sheet 20 includes a central axis AC that runs in the x-direction.

Example glass materials for glass sheet 20 include a flexible glass, such as Corning's WILLOW® glass, or a borosilicate glasses such as PYREX® glass. Other chemically strengthened, flexible glasses can also be used. An advantage of using glass to form the optical interconnector disclosed herein is that it provides a relatively close match to the coefficient of thermal expansions (CTEs) of PICS and OE-PCBs, as discussed below.

The glass sheet 20 needs to be bent to meet OE-PCB design criteria, including in an example an overhead clearance of less than 3.5 mm to maintain a low profile for the optical-electrical (OE) structure being formed. This translates into a bend radius RB in the range from about 2.5 mm to about 3 mm. The bend needs to span about 90 degrees, and in an example spans about 82 degrees.

When the glass sheet 20 is bent, the inside bend surface experiences a maximum compressive stress $CS_{MAX}$ while the outside bend surface experiences a maximum tensile stress $TS_{MAX}$, $TS_{MAX}=-CS_{MAX}$. Moving through the body 21 of the glass sheet 20 from the inside to outside bend surface, the internal stress varies linearly from $CS_{MAX}$ to $TS_{MAX}$.

Figure 2A:
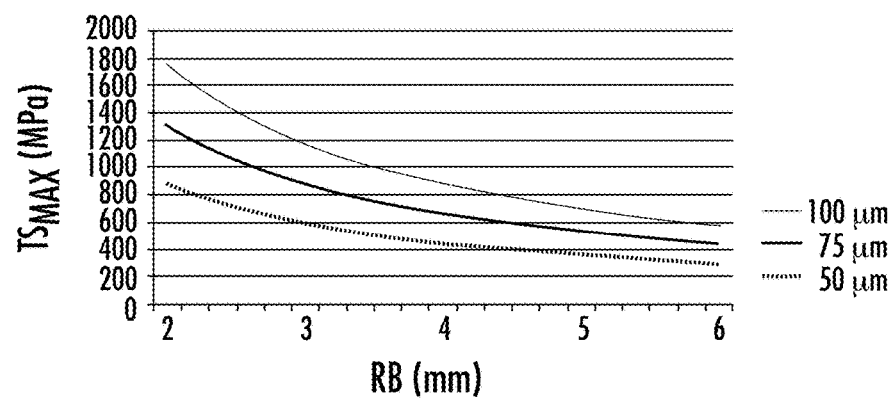
FIG. 2A is a plot of the maximum tensile stress $TS_{MAX}$ (MPa) due to bending versus the bending radius RB (mm) of the glass sheet, for glass sheet thicknesses $TH_G$=100 µm, 75 µm and 50 µm.

The magnitude of the maximum tensile stress $TS_{MAX}$ during bending of the glass sheet 20 scales proportionally to $TH_G/RB$. FIG. 2A is a plot of the maximum tensile stress $TS_{MAX}$ (MPa) due to bending vs. the bending radius RB (mm) of the glass sheet. The plot includes curves for glass sheet thicknesses $TH_G$=100 μm, 75 μm and 50 μm. For a bending radius RB=2.5 mm, the glass sheets of thicknesses $TH_G$=50 μm, 75 μm and 100 μm have a bending stress of about 700 MPa, 1100 MPa and 1500 MPa, respectively. In an example, the bend radius RB is in the range 2 mm≤RB≤10 mm.

Figure 2B:
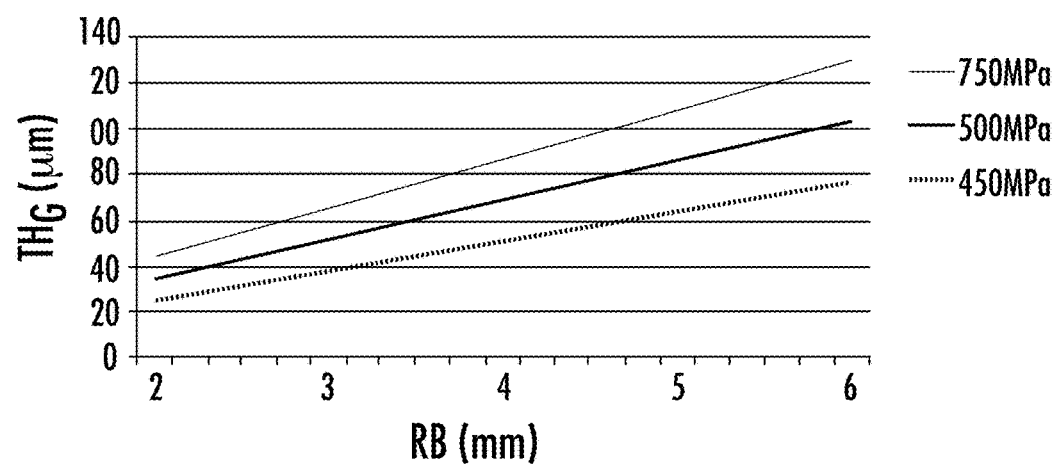
FIG. 2B plots the glass sheet thickness $TH_G$ (µm) versus the bend radius RB (mm) for three different values of the tensile stress TS of FIG. 2A, namely TS=750 MPa, 600 MPa and 450 MPa.

FIG. 2B plots the glass sheet thickness $TH_G$ (μm) versus the bend radius RB (mm) for three different values of the tensile stress TS of FIG. 2A, namely TS=750 MPa, 600 MPa and 450 MPa. From the plot of FIG. 2B, if the tensile stress TS must be kept to 600 MPa or less, and the bend radius RB must be as small as 2.5 mm, the maximum glass thickness $TH_{MAX}$ for the thickness $TH_G$ of glass sheet 20 is about 43 μm.

Glass sheets can fracture when bent or during bending because flaws in the glass structure can initiate crack growth due to the imparted stress. One way to achieve long-term reliability for a bent glass sheet is to eliminate glass flaws, either by preventing them from being created during glass manufacture or by screening tests that discard glass materials with unacceptable flaws.

If flaws cannot be eliminated from the glass sheet, an alternative is to ensure that the glass sheet does not experience substantial tensile stress over its lifetime. This can be accomplished by chemically strengthening the glass sheet through an ion-exchange process. With reference again to FIG. 1, the ion exchange process forms ion-exchanged regions 21R of body 21 of the glass sheet 20 that include exchanged (in-diffused) ions 23. The ion-exchanged regions 21R extend into the body 21 of glass sheet 20 from top surface 22 and optionally bottom surface 24 in the case of a double-sided ion-exchange process. The depth of the ion-exchanged region 21R into body 21 is denoted DOL, which stands for "depth of layer."

As it turns out, the ion-exchange process can be performed in a manner that imparts compression to the glass material by replacing smaller glass ions (e.g., $Na^+$) with larger ones (e.g., $K^+$). As noted above, the tensile strength TS is the greatest closest to the outer bend surface during bending. Thus, in an example, a single ion-exchanged region 21R is formed adjacent the outer bend (e.g., top) surface. The compression force introduced into the ion-exchanged region 21R counters the tensile force in this region due to bending.

A typical compressive stress CS of an ion-exchanged region 21R formed in a glass sheet of thickness TH in the range from 67 μm to 75 μm is estimated to be in the range from 800 MPa to 850 MPa at the outer surface. Assuming a safety margin of 200 MPa, a chemically strengthened glass sheet 20 can be exposed to a tensile stress TS of 600 MPa due to bending while still ensuring that the outer surface of the bend remains in compression.

Figure 2C:
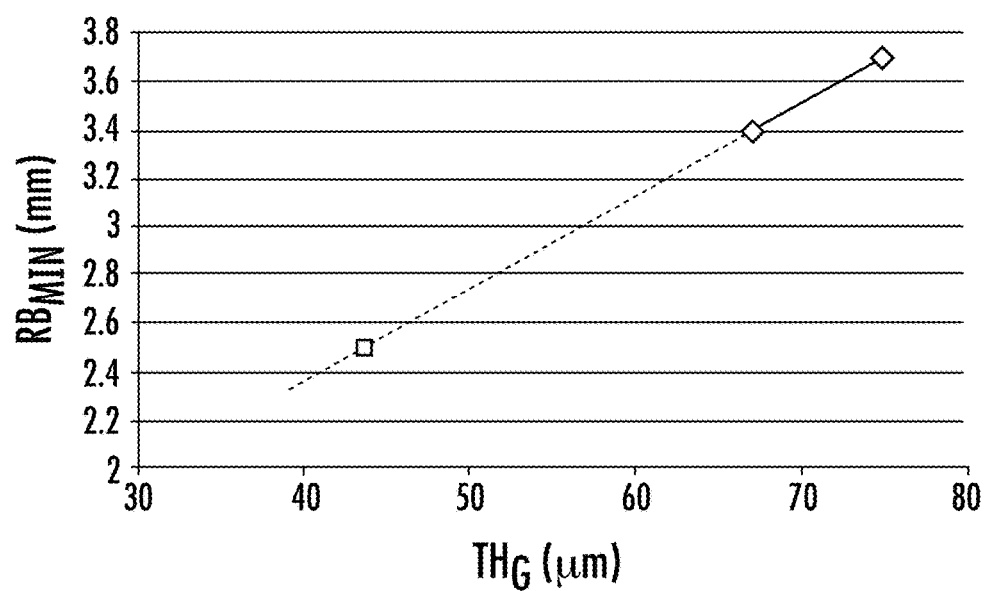
FIG. 2C plots the minimum bend radius $RB_{MIN}$ (mm) versus the glass sheet thickness (µm), with the two data points extrapolated down to a minimum bend radius $RB_{MIN}$ of 2.5 mm, indicating a glass thickness of about 43 µm.

FIG. 2C plots the minimum bend radius $RB_{MIN}$ (mm) versus glass sheet thickness $TH_G$ (μm). Based on the plot of FIG. 2C, the budget for the tensile stress TS corresponds to about a thickness TH of about 43 μm for a target minimum bend radius $RB_{MIN}$=2.5 mm.

Reliability experiments conducted on glass sheets show that a glass sheet with a thickness $TH_G$=67 μm can be bent reliably to a bend radius RB=3.4 mm, and a glass sheet with a thickness $TH_G$=75 μm can be bent reliably to a bend radius of RB=3.7 mm. These results are plotted in FIG. 2C (diamonds), along with a linear extrapolation (dashed line) of the experimental data down to the target minimum bend radius $RB_{MIN}$=2.5 mm representing a minimum bending radius (circle).

While the extrapolated distance from experimental data is large, the result at $RB_{MIN}$=2.5 mm indicates a target glass sheet thickness of about $TH_G$=43 μm. Since ion-exchange regions 21R can be quite thin (e.g., DOL as small as 1 μm to 3 μm), an ion-exchanged region can be formed with a DOL suitable for use with a glass sheet 20 having a thickness $TH_G$ of about 43 μm.

Optical Interconnector with Outside Fiber Array Configuration

Figure 3A:
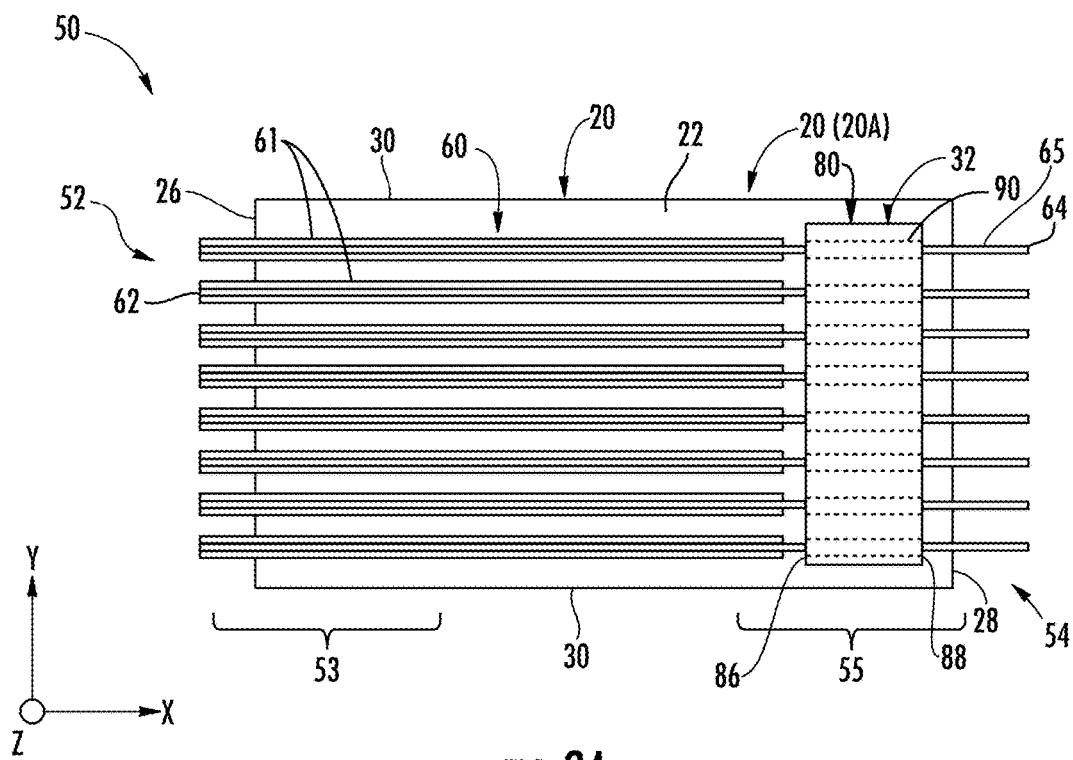
FIG. 3A is a top-down view and FIG. 3B is a side view of an optical interconnector sub-assembly formed during the process of fabricating an example optical interconnector as disclosed herein.
Figure 3B:
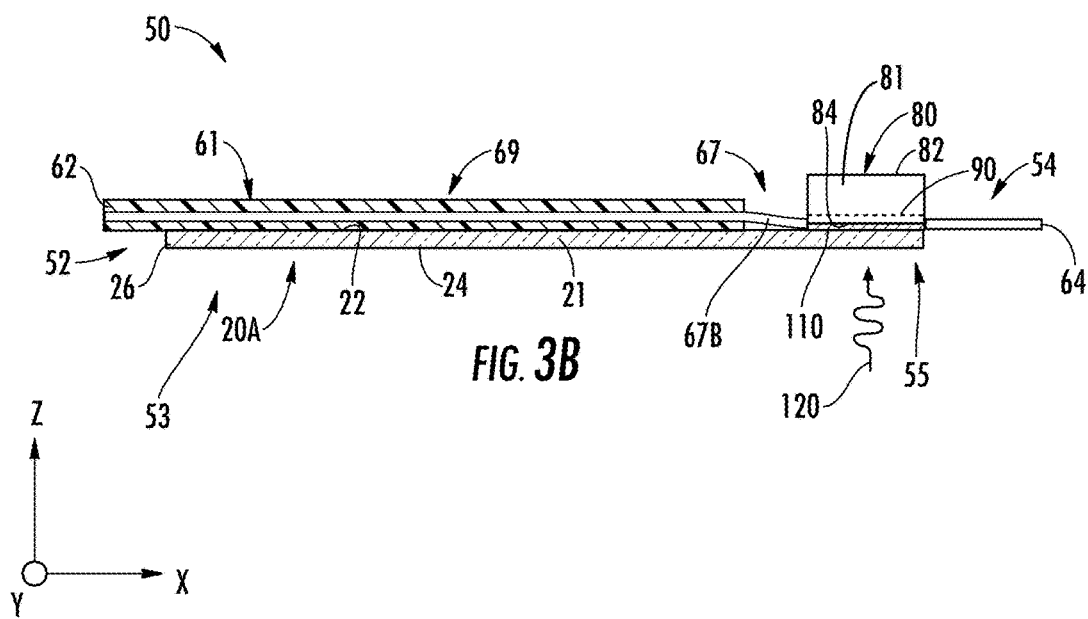

FIG. 3A is a top-down view and FIG. 3B is a side view of an optical interconnector sub-assembly ("sub-assembly") 50 formed during the process of fabricating an example optical interconnector as disclosed herein. The sub-assembly 50 has a front end 52 that resides in a front-end section 53, and a back end 54 that resides in a back-end section 55.

The sub-assembly 50 includes the glass sheet 20 as described above and which is referred to in the present example embodiment as outer glass sheet 20A with thickness $TH_{GA}$ due to its location in the resulting optical connector as described below. In an example, the outer glass sheet 20A is chemically strengthened via ion exchange to define the aforementioned ion-exchanged region 21R to enable it to sustain relatively tight bend radii over long periods of time without failure. The thickness $TH_{GA}$ of outer glass sheet 20A is selected based on the design criteria described above, including a target minimum bend radius. For example, for a target bend radius RB=2.5 mm, the outer glass sheet 20A can have a thickness TH of about 40 μm.

Figure 3C:
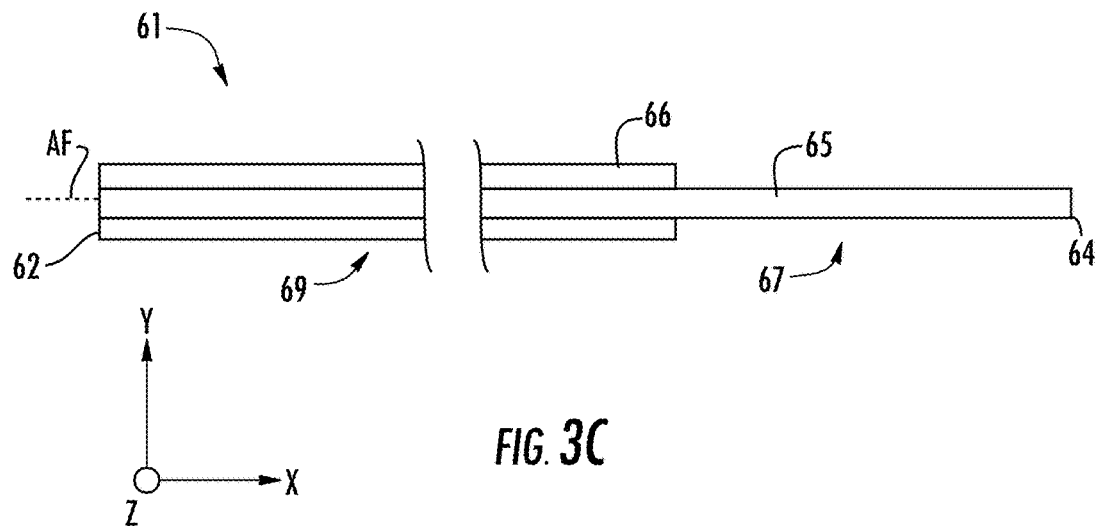
FIG. 3C is a close-up top-down view of an example optical fiber of the optical fiber array of the sub-assembly of FIG. 3A.

The sub-assembly 50 includes an array 60 of optical fibers 61 supported on the top surface 22 of the outer glass sheet 20A. Eight optical fibers 61 are shown in FIG. 3A by way of example. FIG. 3C is a close up view of an example optical fiber 61. The optical fiber 61 has a front end 62 and a back end 64, and a fiber axis AF that runs down the center of the optical fiber. The optical fiber 61 also has a central glass portion 65 surrounded by a non-glass (e.g., acrylate) coating 66. The optical fiber 61 in sub-assembly 50 includes a bare section 67 where the coating 66 has been stripped away to expose the underlying glass portion 65. The remaining portion of the optical fiber 61 defines a coated portion 69.

Figure 3D:
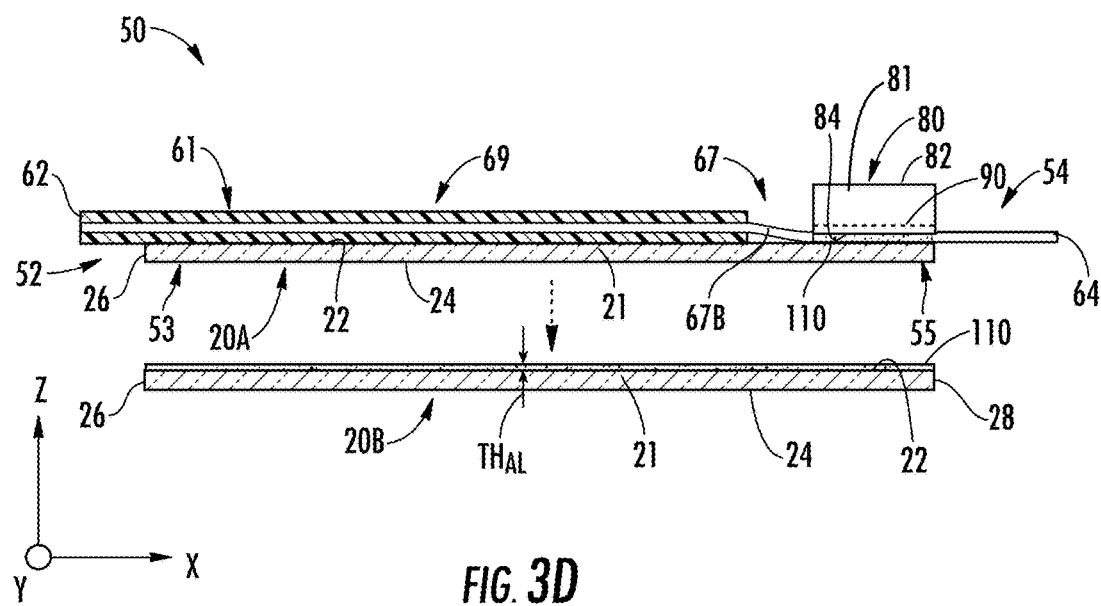
FIG. 3D is similar to FIG. 3C and shows the next step in the fabrication of the sub-assembly wherein the bottom surface of the outer glass sheet of the sub-assembly of FIG. 3C is brought into contact with the top surface of the inner glass sheet.

FIG. 3D is a side view of the sub-assembly 50. The sub-assembly 50 includes an alignment block 80 used to align the optical fibers 61 of the optical fiber array 60 so that the optical fibers run in the x-direction and are substantially parallel. The alignment block 80 is disposed in a fiber alignment zone 32 adjacent the back end 28 of the outer glass sheet 20A and atop bare sections 67 of optical fibers 61. In an example, the fiber alignment zone 32 has (x, y) dimensions of 2 mm×3 mm. Other sizes for the fiber alignment zone 32 can also be used, depending on the number of the optical fibers 61 in the optical fiber array 60, etc.

In an example, the alignment block 80 is made of glass. The alignment block 80 has a body 81, a top surface 82, a bottom surface 84, a front end 86 and a back end 88. The alignment block 80 includes fiber alignment features 90 on the bottom surface 84. In an example, the fiber alignment features 90 are in the form of grooves (e.g., V-grooves) formed in the bottom surface 84 and that run in the x-direction (e.g., the V-grooves are parallel). Thus, the fiber alignment features 90 engage the bare sections 67 of optical fibers 61 in the fiber alignment zone 32 in a select alignment (e.g., parallel and in the x-direction) while the coated portions 69 of the optical fibers reside on the top surface 22 of outer glass sheet 20A. The coating 66 is kept in place on optical fibers 61 in coated portion 69 to prevent optical fiber damage due to contact with the outer glass sheet 20A, and to protect the exposed optical fiber during the assembly process.

Prior to positioning the alignment block 80 in the fiber alignment zone 32, an adhesive 110 is applied to the bare sections 67 of the optical fibers 61 and to the corresponding portion of the top surface 22 of the outer glass sheet 20A in the fiber alignment zone. In an example, the adhesive 110 has a relatively low shrinkage during curing and a good CTE match to glass sheet 20. The adhesive 110 may be UV curable for faster processing, and may also be thermally curable to provide more mechanically robust bonding.

The alignment block 80 is then lowered onto the bare section 67 of optical fibers 61 and the adhesive 110 residing thereon, causing the optical fibers to be precisely aligned to each other in the select alignment, e.g., parallel as shown. The alignment block 80 and the bare sections 67 of the optical fibers 61 engaged therewith are then bonded to the top surface 22 of the outer glass sheet 20A by activating the adhesive 110, e.g., by exposing the adhesive to activating energy 120, such as UV radiation or heat. The remaining portions of the optical fibers 61 are unattached to the top surface 22 of the outer glass sheet 20A The top surface 22 of the outer glass sheet 20A preferably has a good flatness (e.g., to within 0.5 μm, and preferably to within 0.2 μm) over the fiber alignment zone 32. Likewise, the bottom surface 84 of the alignment block 80 has good flatness to ensure proper bonding with the adhesive 110. In an example, the alignment block 80 may be intentionally distorted via external forces so that it is made flat during the adhesive bonding process. For example, pressure can be applied at the bottom surface 24 of the outer glass sheet 20A at the fiber alignment zone 32 so that the upper surface 22 of the outer glass sheet conforms to alignment features 90 on the bottom surface 84 of alignment block 80. Alternatively, a vacuum can be applied to V-groove alignment features 90 channels so that the outer glass sheet 20A deflects upward and into contact with the V-grooves and the bottom surface 84 of the alignment block 80.

In an example, the bare fiber section 67 is made longer than the x-dimension of the fiber alignment zone 32 so that it extends beyond the front and back ends 86 and 88 of the alignment block 80. In this configuration, the bare fiber section 67 will have a bend portion 67B adjacent the front end 86 of alignment block 80 due to the thickness of coating 66. In practice, the bend portion 67B can have gradual S-bend profile to minimize stress concentrations that can otherwise occur in relatively tight fiber bends.

In an example, the bend portion 67B can be protected from damage by applying a protective coating (not shown) during or after adding the fiber alignment block 80 to the sub-assembly 50. In another example, the thickness of the coating 66 can be tapered on the side that contacts the top surface 22 of the outer glass sheet 20A to reduce the amount of bending in the bare fiber section 67 while also limiting the exposure of the bare fiber section 67. This tapering can be accomplished by mechanical trimming (e.g., grinding) or by selective plastic deformation and displacement of the coating 66 near the fiber alignment zone 32.

In another example, a relief step (not shown) can be formed in the outer glass sheet 20A via mechanical grinding, hot glass pressing or bending.

In another example, a thin glass shim (not shown) can be disposed between alignment block 80 and outer glass sheet 20A with a thickness equal to the thickness of coating 66 so that the optical fibers 61 can remain substantially straight as they enter alignment block 80. This embodiment allows for coating 66 to run right up to front end 86 of alignment block 80.

In another example, a protective adhesive layer (not shown) can be applied to the fiber alignment zone 32 both to protect the optical fibers 61 and to provide a form of mechanical strain relief on the optical fibers to prevent the buildup of axial tension to the bare section 67 during assembly and bending steps described below.

In another example, the bare section 67 is made much longer in the direction toward the front ends 62 of the optical fibers 61 and then a protective coating is added after the alignment block 80 is operably arranged in the fiber alignment zone 32.

Figure 3E:
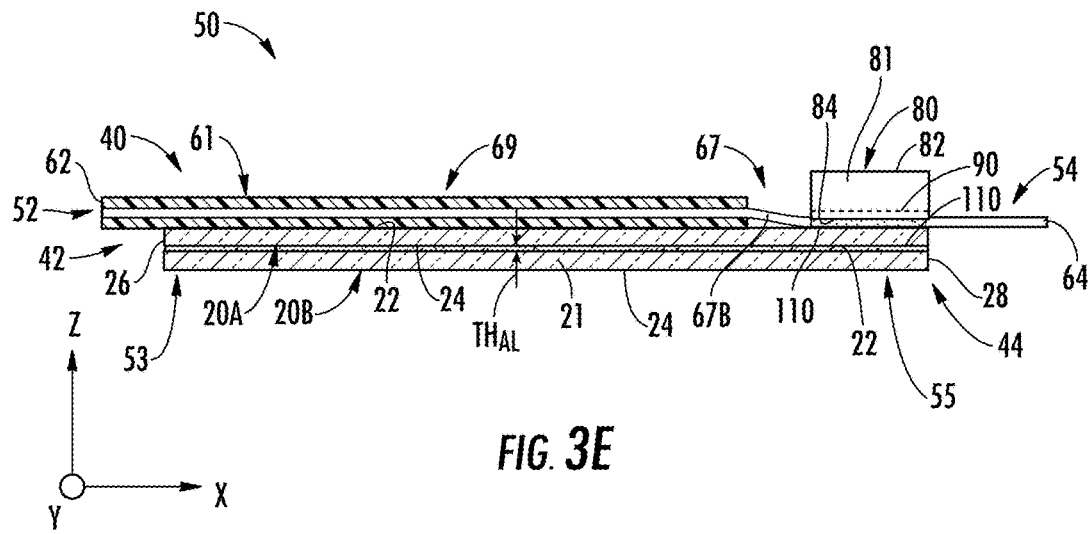
FIG. 3E is similar to FIG. 3D and shows the resulting sub-assembly that now includes a laminated structure.

FIG. 3D is similar to FIG. 3C and shows the next step in the fabrication of the sub-assembly 50 wherein the bottom surface 24 of the outer glass sheet 20A of the sub-assembly from FIG. 3C is brought into contact with the top surface 22 of another glass sheet 20, which is referred to and identified herein as inner glass sheet 20B. A thin layer of adhesive 110 is applied between the outer and inner glass sheets 20A and 20B to hold them in contact during assembly and to define a laminated structure 40 that has a front end 42 with a thickness $TH_{LF}$ and a back end 44 with a thickness $TH_{LB}$. The adhesive layer 110 is initially uncured, which allows for the outer and inner glass sheet 20 to be laterally displaced under shear force during assembly, while atmospheric pressure prevents them from being delaminated under moderate normal forces. FIG. 3E is similar to FIG. 3D and shows the resulting sub-assembly 50 formed by adding the inner glass sheet 20B as described above.

Figure 4A:
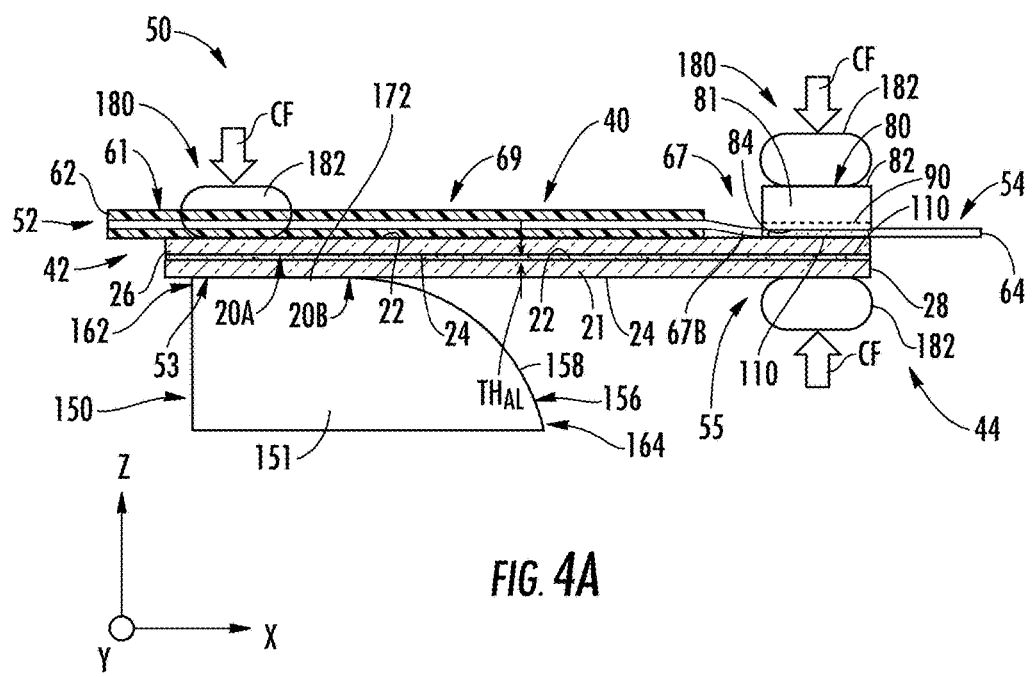
FIG. 4A is similar to FIG. 3E and shows the sub-assembly from FIG. 3E operably arranged relative to a bending fixture in anticipation of carrying out a bending process, wherein the optical fiber array is supported on the top surface of the outer glass sheet.

FIG. 4A is similar to FIG. 3E and shows the sub-assembly 50 from FIG. 3E operably arranged relative to a bending fixture 150 in anticipation of carrying out the next step in the fabrication process. The bending fixture 150 has a body 151 and includes an outer surface 156 that has a curved portion 158. The outer surface 156 has an upper end 162 and a lower end 164. The outer surface 156 includes a flat section 172 at upper end 162. The curvature of curved portion 158 is in the x-z plane, i.e., the curvature is cylindrical. The curvature of curved portion 158 is also convex. The bending fixture 150 may be fabricated from glass or another UV transparent material to enable UV curing of the laminated structure 40 of the sub-assembly 50 through body 151 of bending fixture 153. The bending fixture 150 may also be fabricated from material with high thermal conductivity to facilitate thermal curing of the adhesive 110 to solidify the laminated structure 40.

The front end 52 of the sub-assembly 50 is held firmly in contact with bending fixture 150 at the flat section 172 at upper end 162 of outer surface 156. This is accomplished in one example by a first clamping apparatus 180 that in an example includes a single clamping pad 182 that squeezes the front end 52 of the sub-assembly against the flat section 172 of outer surface 156 of bending fixture 150. The first clamping apparatus 180 is applied to the sub-assembly 50 in a manner that prevents the inner and outer glass sheets 20A and 20B from being laterally displaced (i.e., displacement in the y-direction) relative to one another while allowing for longitudinal or shear displacement (i.e., displacement in the x-direction). The first clamping apparatus 180 is also applied to the front end 52 of the sub-assembly 50 such that it contacts the top surface 22 of the outer glass sheet 20A but not any of the optical fibers 61. The optical fibers 61 are therefore free to move longitudinally relative to the top surface 22 of the outer glass sheet 20A during the bending process.

A bend is imparted to the laminated structure 40 of the sub-assembly 50 by applying a downward force FD (i.e., a force that at least initially has a substantial component in the −z direction) at the back end 54 of the sub-assembly. A convenient location for applying the downward force is the alignment block 80. In an example, the alignment block 80 is held by a second clamping apparatus 180, which in the example shown includes two clamping pads 182. Like the first clamping apparatus 180, the second clamping apparatus 180 is configured so that the clamping pads 182 hold the outer and inner glass sheets 20A and 20B in contact with each other so that they do not separate during the bending process while also allowing for the longitudinal or shear displacement of the inner and outer glass sheets relative to each other.

Figure 4B:
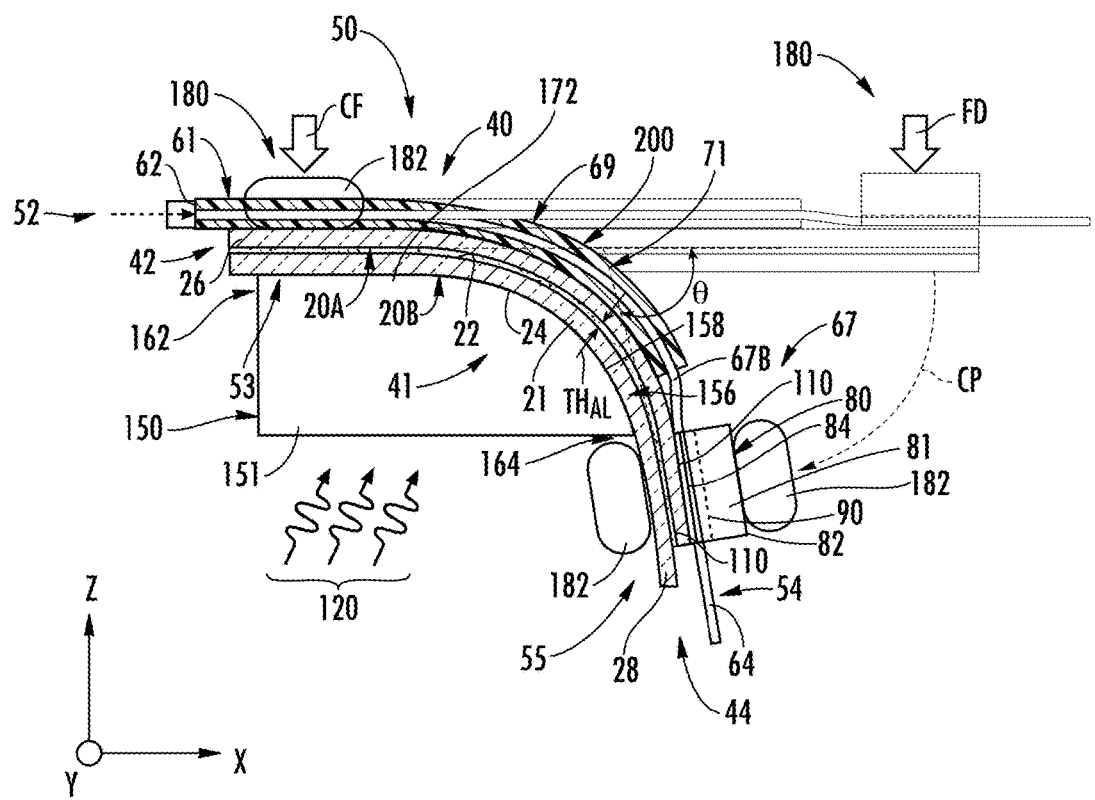
FIG. 4B is similar to FIG. 4A and further illustrates the bending process.

FIG. 4B is similar to FIG. 4A and further illustrates the bending process for sub-the assembly 50. During the bending process, the clamping pads 182 of the second clamping apparatus 180 are rotated together along a curved path CP in a clockwise direction so that the outer and inner glass sheets 20A and 20B of the laminated structure 40 bend and conform to the curved surface portion 158 of the outer surface 156 of the bending fixture 150.

During the bending process, the adhesive 110 remains uncured. This allows the outer and inner glass sheets 20A and 20B of the laminated structure 40 to move longitudinally relative to one another while remaining in close contact via the sandwiched adhesive layer 110. Since the optical fibers 61 are not yet attached to the top surface 22 of the outer glass sheet 20A except at the back end 54 of the sub-assembly 50 at the fiber alignment zone 32, the optical fibers are free to move (slide) axially along the top surface as the outer and inner glass sheets 20A and 20B are bent. This allows the optical fibers 61 to remain substantially unstretched during and after the bending process. In an example, the clamping pads 182 can be configured to move during the bending process to track the relative displacement of outer and inner glass sheets 20A and 20B as they slide relative to each other. In an example, the optical fibers 61 are not stretched at during and after the bending process.

In an example, the outer surface 156 of the bending fixture 150 can include a protective coating (not shown) that is compliant and UV transparent to prevent damage to the bottom surface 24 of the inner glass sheet 20B during bending. Alternatively, a disposable film (not shown) may be applied to the curved portion 158 for each bending process.

The bending process imparts a bend section 41 to the laminated structure 40. The bend section 41 has bend angle θ that in an example is between 80° and 90°. For example, the bend angle θ=82° so that it provides an 8° angle at the fiber back end after polishing. In an example, the bend section 41 has a bend radius RB in range of 2 mm≤RB≤10 mm, which in an example is measured to the bottom surface 24 of the inner glass sheet 20B of the laminated structure 40, while in another example is measured to the middle of the laminated structure between the inner and outer glass sheets 20B and 20A.

With continuing reference to FIG. 4B, once the bend section 41 is formed, then the adhesive 110 of the laminated structure 50 is rapidly cured. This can be accomplished by exposing the adhesive 110 to activating energy 120, e.g., UV radiation, to solidify the laminated structure. The cured adhesive 110 holds the outer and inner glass sheets 20A and 20B together and prevents any lateral or longitudinal displacements so that the laminated structure 40 maintains bend section 41 and thus a fixed curvature after removal of sub-assembly 50 from bending fixture 150.

The bending process that imparts the bend section 41 to the laminated structure 40 also imparts to each optical fiber 61 a bend section ("fiber bend section") 71 that follows (and is thus defined by) the bend section 41. The fiber bend section 71 has a bend radius $RB_F$ that is slightly greater than the bend radius RB of the laminated structure 40.

Figure 4C:
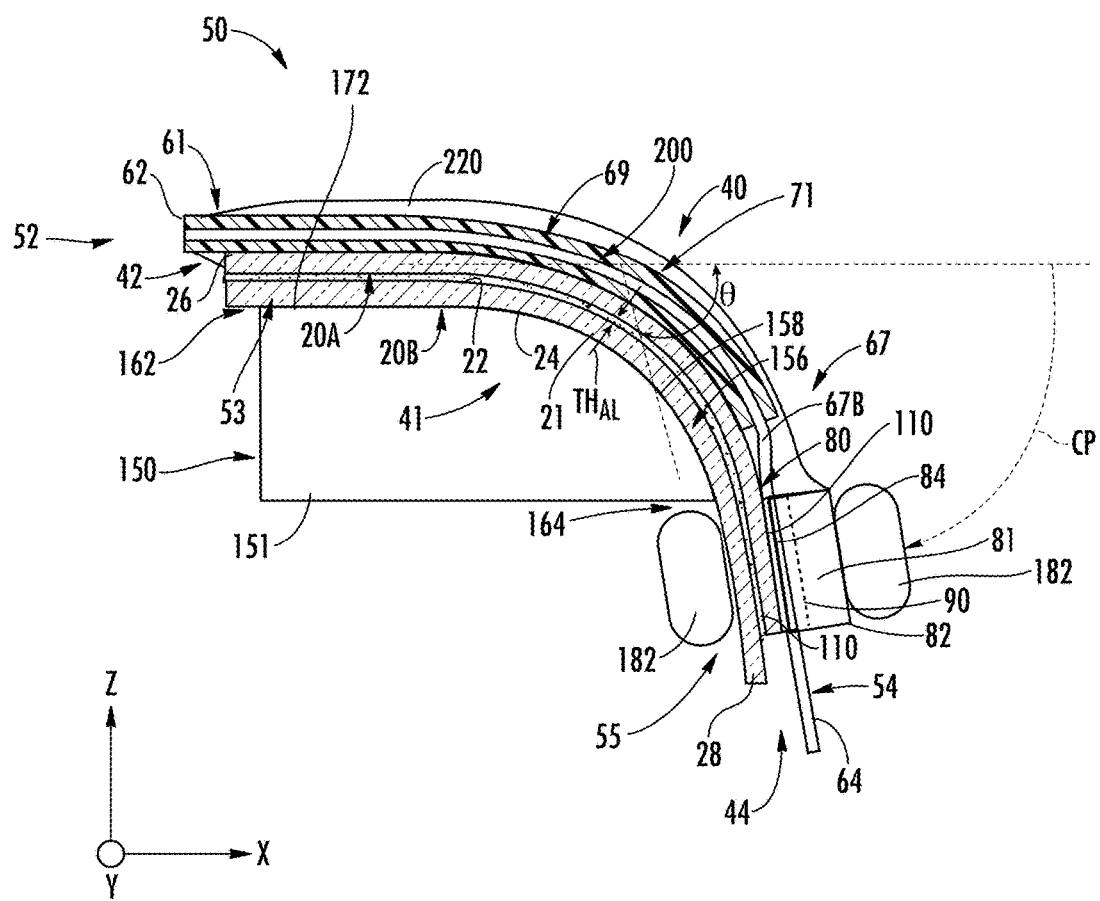
FIG. 4C is similar to FIG. 4B and shows an optional additional fabrication step wherein a protective coating is applied over the optical fiber array prior to removal of the sub-assembly from the bending fixture.

FIG. 4C is similar to FIG. 4B and shows an optional additional fabrication step wherein a protective coating 220 is applied over the optical fiber array 60 and at least a portion of the top surface 22 of the outer glass sheet 20A prior to removal of the sub-assembly from the bending fixture 150.

The protective coating 220 can also serve to bond the optical fibers 61 to the top surface 22 of the outer glass sheet 20A, thereby providing strain relief under optical fiber axial and lateral loading.

Figure 5A:
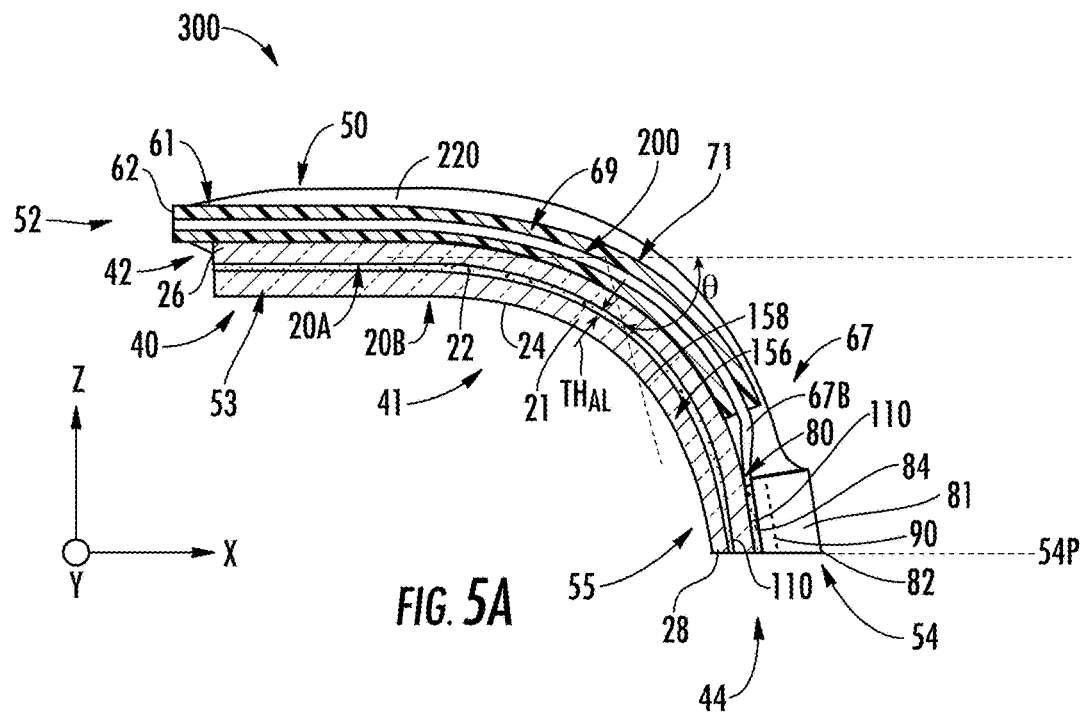
FIG. 5A is similar to FIG. 4C and shows a final step in the fabrication process wherein the sub-assembly is removed from the bending fixture and the back-end section is processed to form the optical interconnection apparatus.

FIG. 5A is similar to FIG. 4C and shows a final step in the fabrication process wherein the sub-assembly 50 is removed from the bending fixture 150 and the back-end section 55 is processed to form the optical interconnector 300. This final step includes removing excess material from the back-end section 55 to form a (new) planar back end 54. This fabrication step can include mechanical (e.g., diamond saw) cutting and polishing a portion of the alignment block 80, the bare sections 67 of the optical fibers 61 and the laminated outer and inner glass sheets 20A and 20B so that the entire back end 54 resides in a back-end plane 54P. In an example, the polishing step results in polished back ends 64 (i.e., optical quality end laces) of the optical fibers 61. In an example, this final fabrication step can optionally be conducted prior to removing the sub-assembly 50 from the bending fixture 150.

The above-described embodiment of the optical interconnector 300 has the optical fiber array 60 residing on the outside of the bend section 41 of the laminated structure 40. The above-described embodiment of the optical interconnector 300 utilized two glass sheets 20, i.e., the outer and inner glass sheets 20A and 20B. More than two glass sheets 20 can be used to form the laminate structure 40 using essentially the same steps as described above to provide sufficient stiffness, and the two-sheet embodiment is set forth in detail by way of example.

Figure 5B:
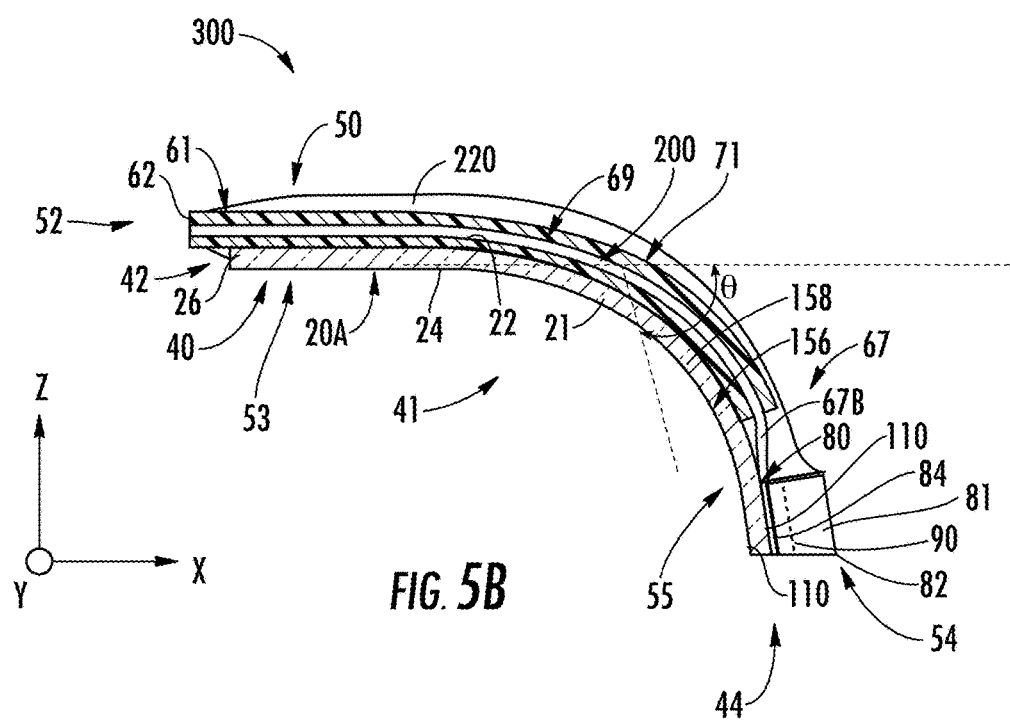
FIG. 5B is similar to FIG. 5A and shows an example wherein a single glass sheet is used in combination with the optical fiber array and the protective coating in the case where the protective coating can provide adequate stiffness.

FIG. 5B is similar to FIG. 5A and illustrates an embodiment of the optical interconnector 300 that utilizes just a single glass sheet 20. An embodiment of the optical interconnector 300 that utilizes the single glass sheet 20 can be employed if the protective coating 220 has a sufficiently high modulus of elasticity (i.e., is sufficiently stiff) so that it can help retain the curved shape defined by bend section 41 after removal from the bending fixture 150. A single-sheet embodiment for the optical interconnector 300 can simplify the assembly process and reduce material and fabrication costs.

Optical Interconnector with Inside Optical Fiber Array Configuration

Figure 6A:
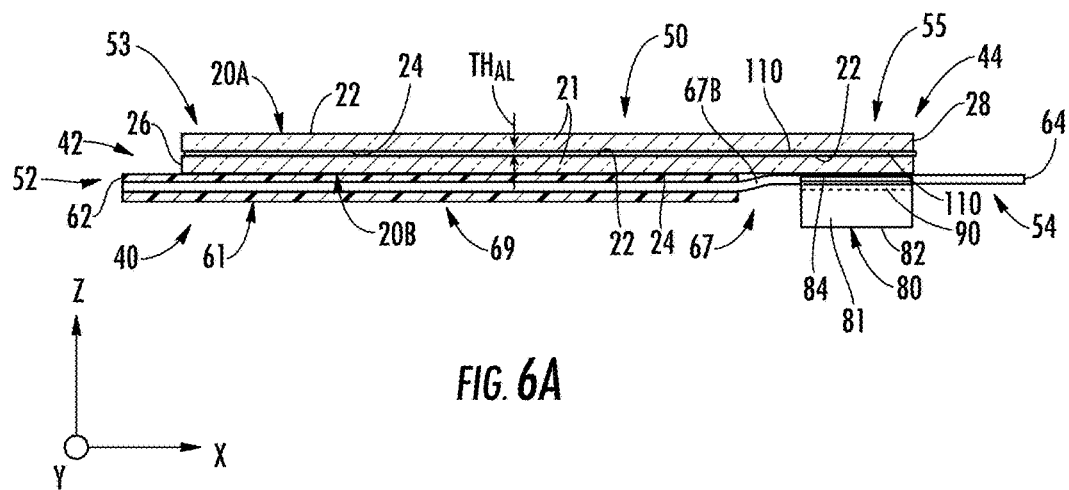
FIG. 6A is a side view of an example sub-assembly similar to that shown in FIG. 3E, but wherein the optical fiber array and the alignment block reside adjacent the bottom surface of the inner glass sheet.
Figure 6B:
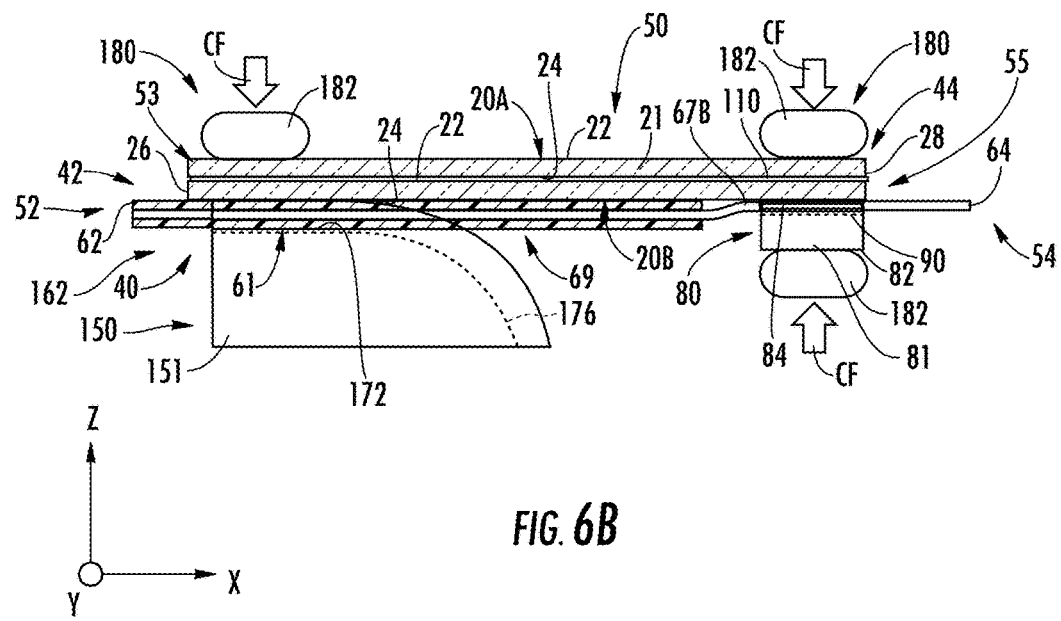
FIG. 6B is similar to FIG. 4A and shows the sub-assembly from FIG. 6A operably arranged relative to a bending fixture in anticipation of carrying out a bending process.

Another embodiment of the optical interconnector 300 provides the optical fiber array 60 on the inside bend of the laminated structure 40. With reference to FIG. 6A, the fabrication of this embodiment of the optical interconnector 300 starts out by forming the sub-assembly 50 as shown in FIG. 3E as described above. The sub-assembly 50 is then positioned upside-down relative to bending fixture 150, as shown in FIG. 6B. As before, the outer and inner glass sheets 20A and 20B are joined with an uncured adhesive 110, allowing them to slide over one another during assembly. It is noted here that since the laminated structure 40 is flipped over, what was the "outer" glass sheet 20A in the previous embodiment is now the "inner" glass sheet 20B, and what was the "inner" glass sheet 20B in the previous embodiment is now the "outer glass" sheet 20A.

Thus, with reference to FIG. 6B, the laminated structure 40 of the sub-assembly 50 is bent using the bending fixture 150 in much the same way as in the previous embodiment. In an example, the bending fixture 150 now includes recesses 176 in outer surface 156 that provide relief for optical fibers 61, which now reside on the bottom surface 24 of the inner glass substrate 20B of the laminated structure 40. The uncured adhesive 110 between the outer and inner glass sheets 20A and 20B is activated, e.g., with activating energy 120 as before, to solidify the laminate structure 40.

Figure 7A:
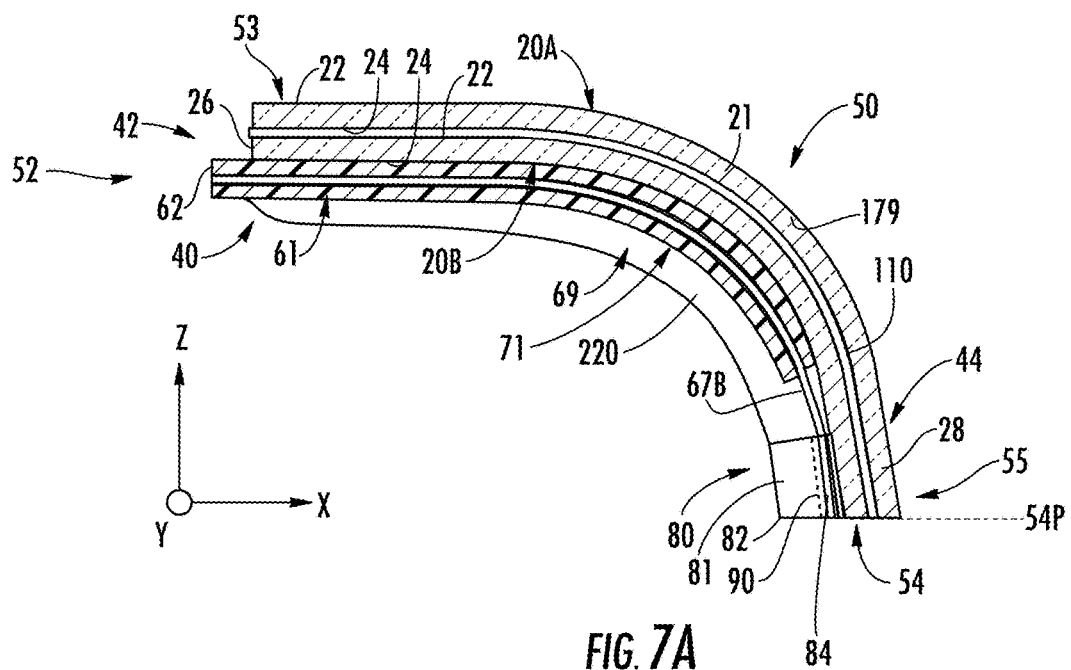
FIG. 7A shows the resulting optical interconnection apparatus formed by the bending process of FIG. 6C and by processing the back-end section of the sub-assembly.

Once the adhesive 110 is fully cured, the laminated structure 40 is unclamped and the sub-assembly 50 is removed and the back-end section 55 is processed to form the optical interconnector 300 as shown in FIG. 7A. In an example, the protective coating 220 can be applied to the optical fiber array 60 to hold the optical fibers 61 in place on the bottom surface 24 of the inner glass substrate 20B and to protect the optical fibers from being damaged during assembly and handling.

Figure 6C:
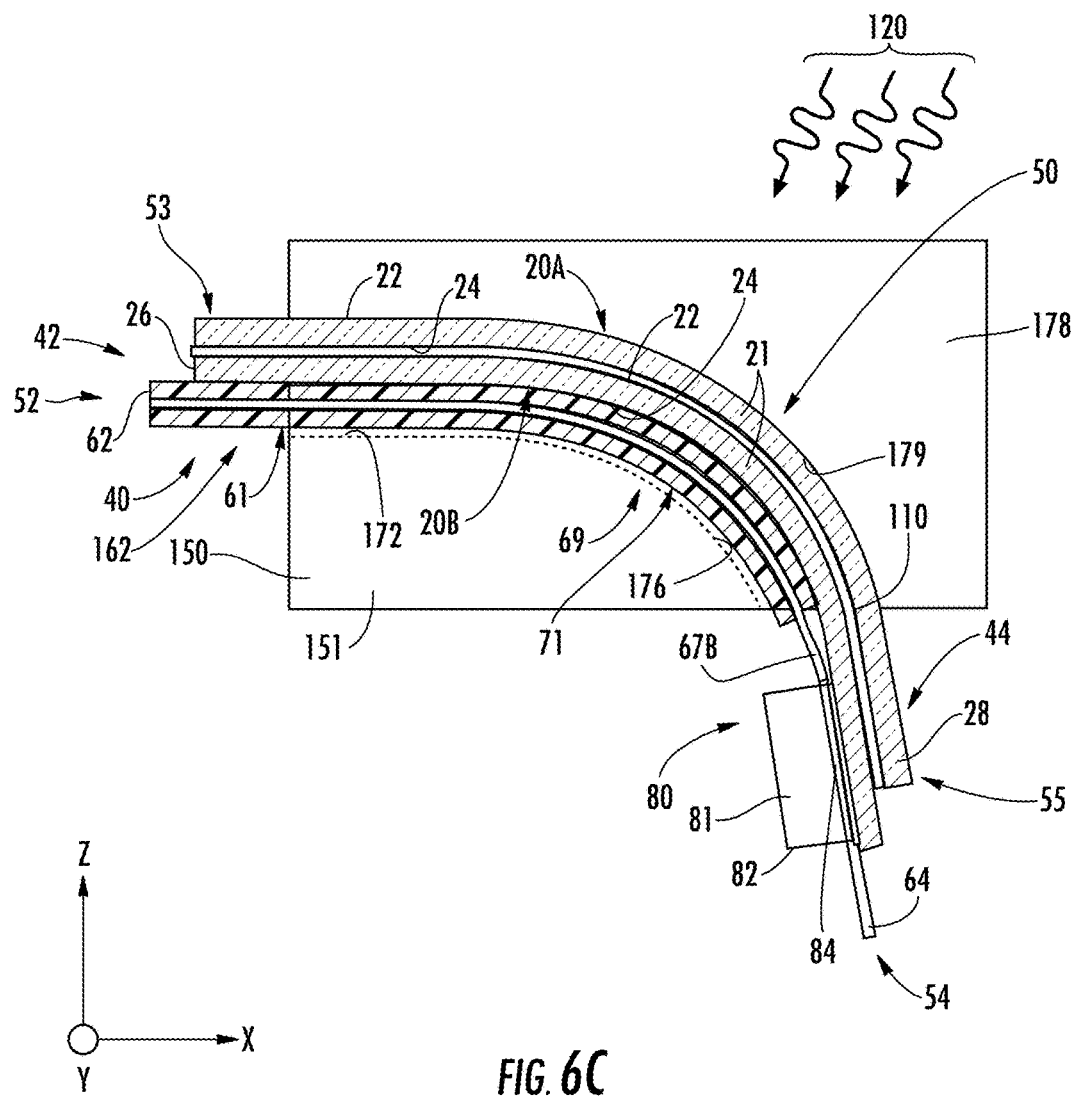
FIG. 6C is similar to FIG. 6B and shows the sub-assembly arranged in the bending fixture, which includes a transparent concave bend member with a concave surface.

FIG. 6C shows an example embodiment of the bending fixture 180 that includes an additional concave-bend member 178 that has a concave outer surface 179. The concave-bend member 78 is disposed so that convex outer surface 176 and concave outer surface 179 sandwich the laminated structure 40 and a portion of the optical fiber array 60. In an example the concave-bend member 178 is transparent to activating energy 120 so that activation of the adhesive 110 can then be performed by directing the activating energy through the concave-bend member.

Figure 7B:
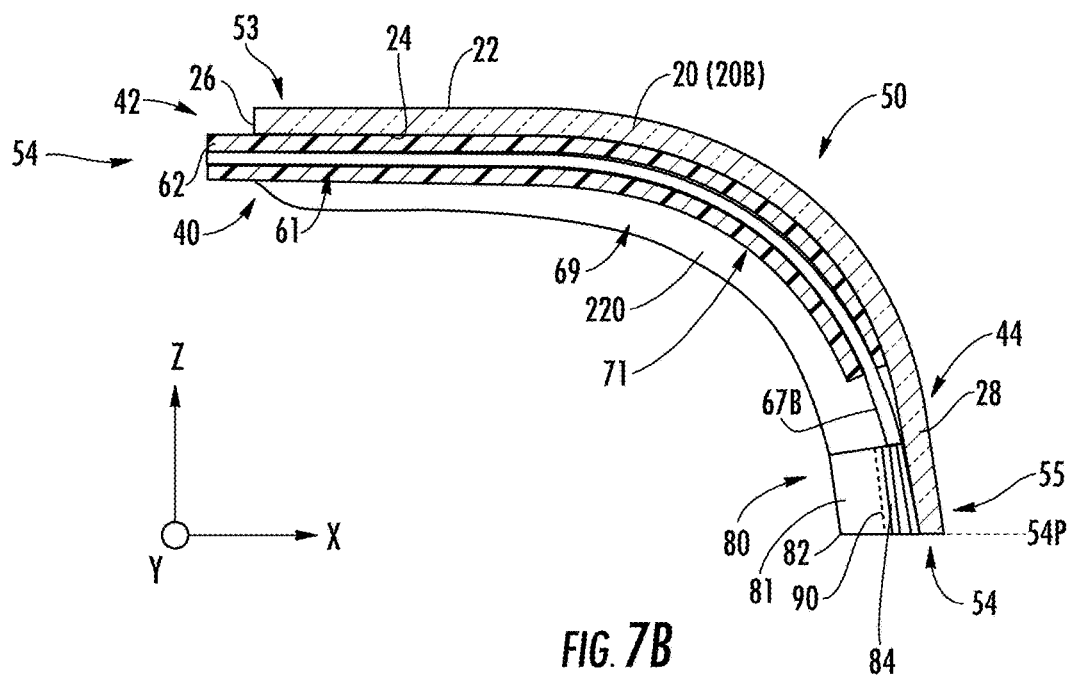
FIG. 7B is similar to FIG. 7A and shows an example embodiment wherein the sub-assembly includes a single glass sheet in the case wherein the protective coating added to the sub-assembly over the optical fiber array has sufficient stiffness.

FIG. 7B is similar to FIG. 5B and shows a single-sheet embodiment of the optical interconnector 300 wherein the protective coating 220 adds sufficient stiffness to the laminated structure 40 to maintain bend section 41.

Optical Interconnector with Sandwiched Optical Fiber Array Configuration

Another embodiment of the optical interconnector 300 provides the optical fiber array 60 sandwiched within the laminated structure 40. This sandwiched embodiment protects optical fibers 61 of optical fiber array 60 from being damaged during handling and packaging.

Figure 8A:
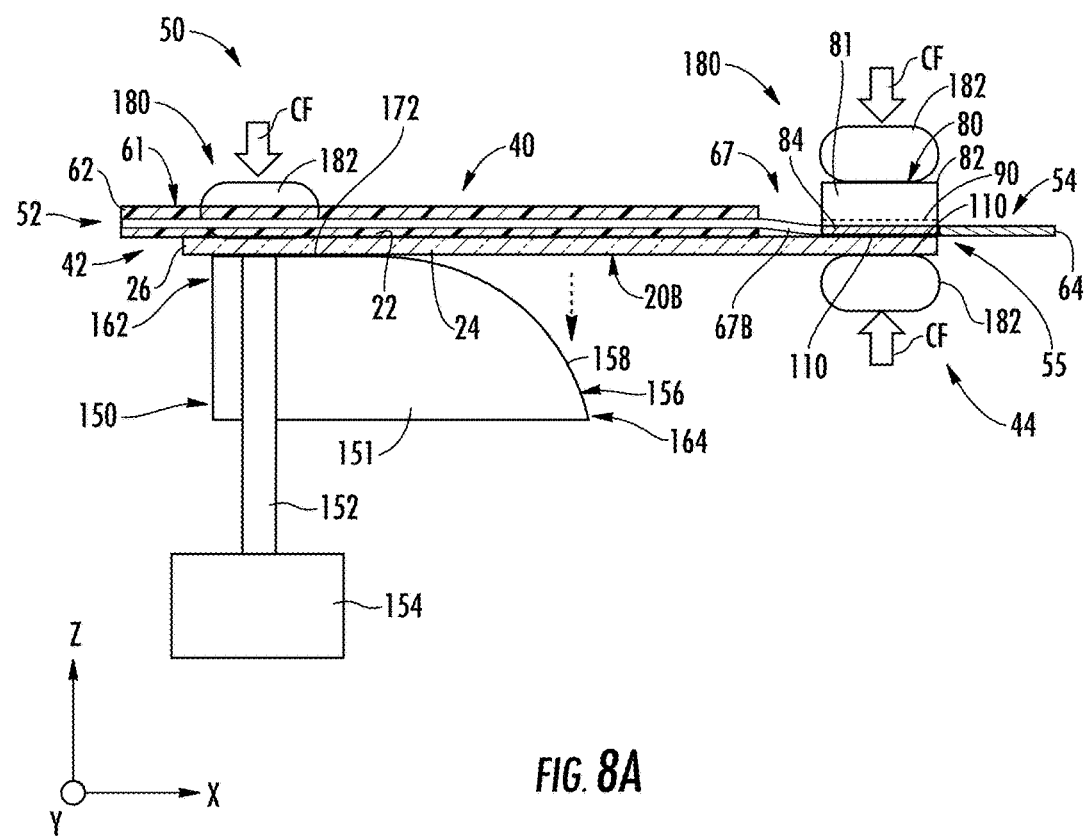
FIG. 8A shows the sub-assembly of FIG. 3A operably disposed on a bending fixture in anticipation of carrying out a bending process.

The fabrication process starts with the sub-assembly 50 as shown in FIG. 3A. This sub-assembly 50 is then operably disposed on the bending fixture 150 as shown in FIG. 8A, with the front-end section 53 of the sub-assembly residing upon the flat section 172 of the outer surface 156. In an example, the first and second clamping apparatus 180 are employed as described above. In this embodiment, the bending fixture 150 optionally includes a vacuum channel 152 that has an open end at flat section 172. The vacuum channel 152 is connected to a vacuum source 154 that provides a vacuum that assists in holding the front-end section 52 of the sub-assembly 50 to the flat section 172. The utility of the vacuum channel 152 in the fabrication process is discussed further below.

Figure 8B:
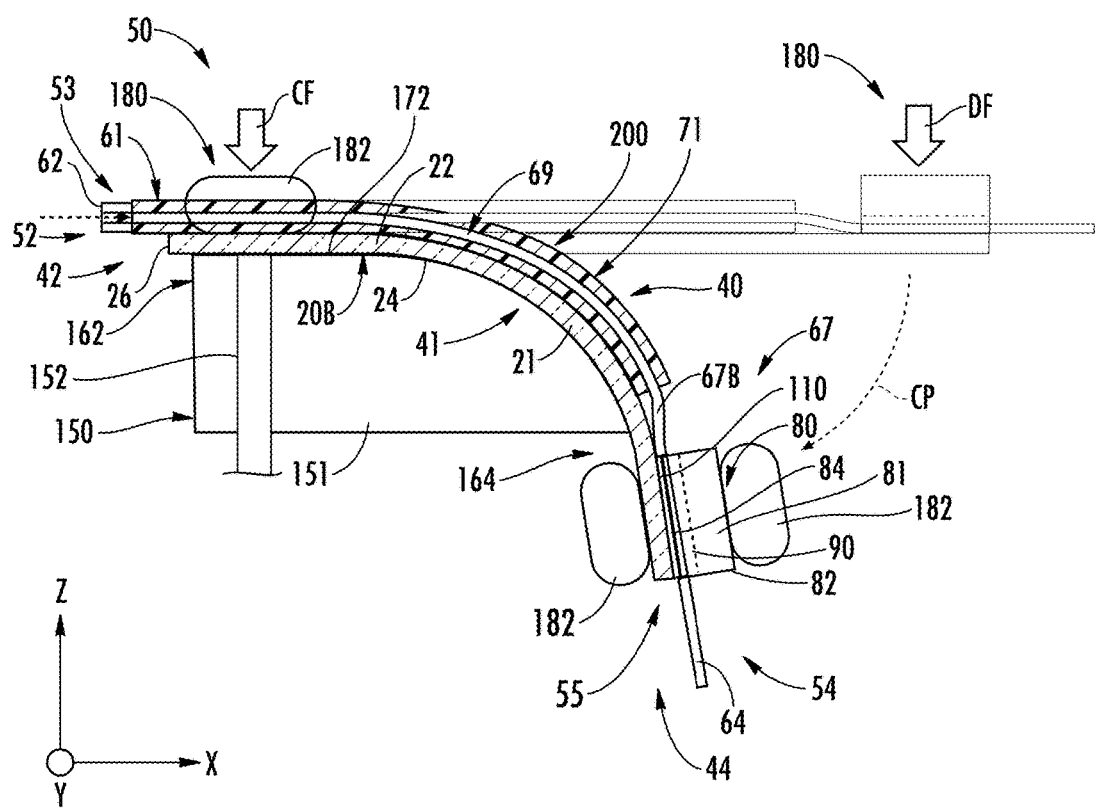
FIG. 8C is similar to FIG. 8B and shows the addition of an adhesive layer on the top surface of the inner glass sheet and the optical fiber array residing thereon.
FIG. 8D is similar to FIG. 8C and shows an outer glass sheet disposed relative to the newly added adhesive layer in anticipation of forming a bent laminated structure with the optical fiber array sandwiched within.
FIG. 8E is similar to FIG. 8D and shows the outer glass sheet bent relative to the adhesive layer and the optical fiber array, and also shows activating energy directed through the bending fixture to cure the adhesive layer.

With reference to FIG. 8B, the second clamping apparatus 180 is rotated clockwise through an arc to form bend section 41 in the existing laminated structure 40.

Figure 8C:
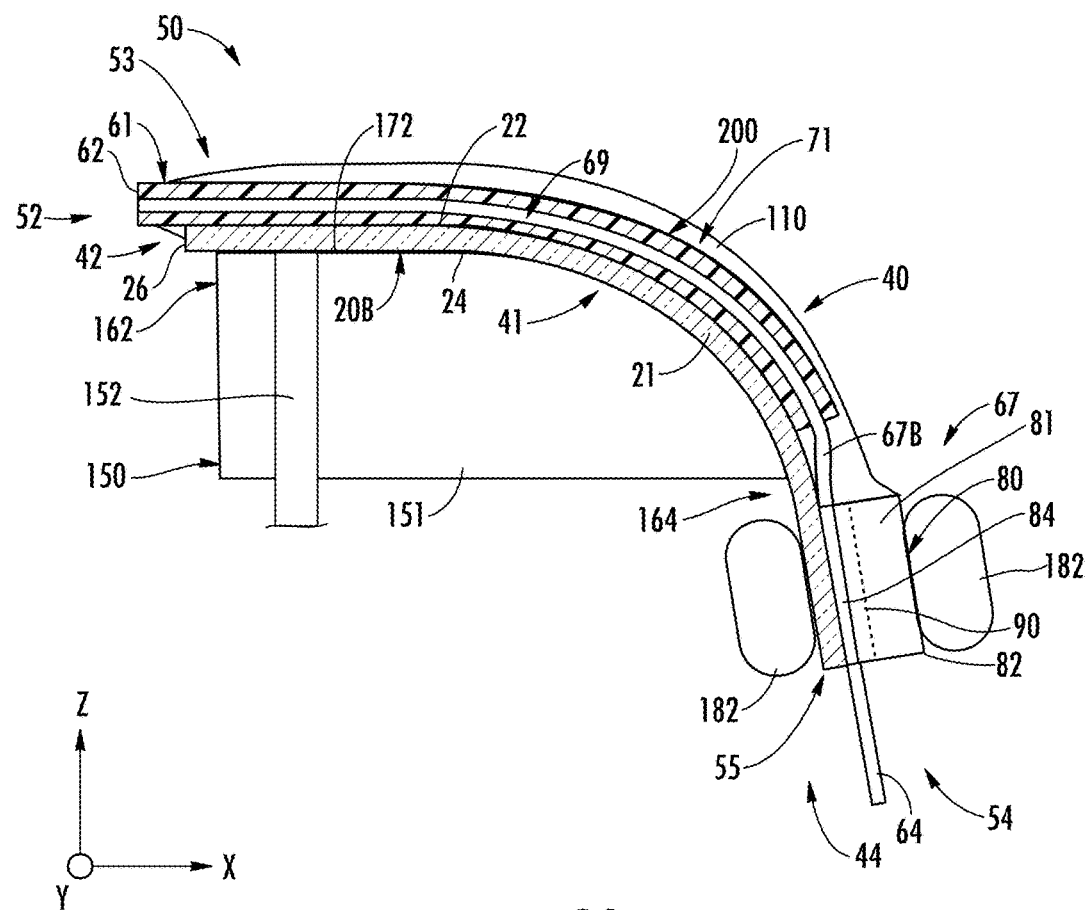

With reference to FIG. 8C, adhesive 110 is now applied over the optical fiber array 60. Since the adhesive 110 is preferably applied over the entire optical fiber array 60, the first clamping apparatus 180 may need to be removed or replaced with a pad that provides a smaller contact area. Alternatively, the front-end section 53 of the sub-assembly 50 can be secured to the flat section 172 of the outer surface 156 using the vacuum channel 152. Additional vacuum channels 152 (not shown) may also be arranged to have open ends at the outer surface 156 at or near the lower end 164 to eliminate the need for the second clamping apparatus 180.

Figure 8D:
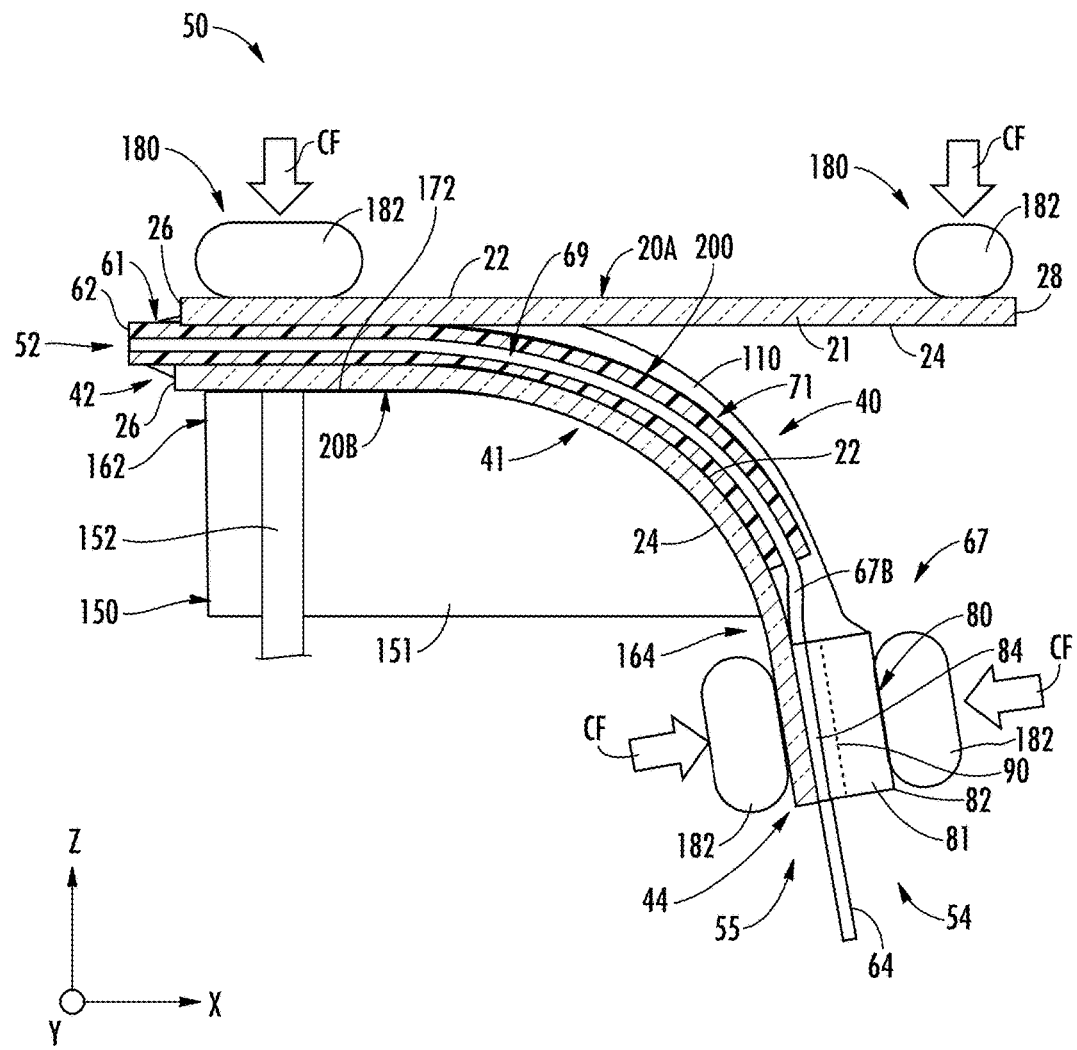
Figure 8E:
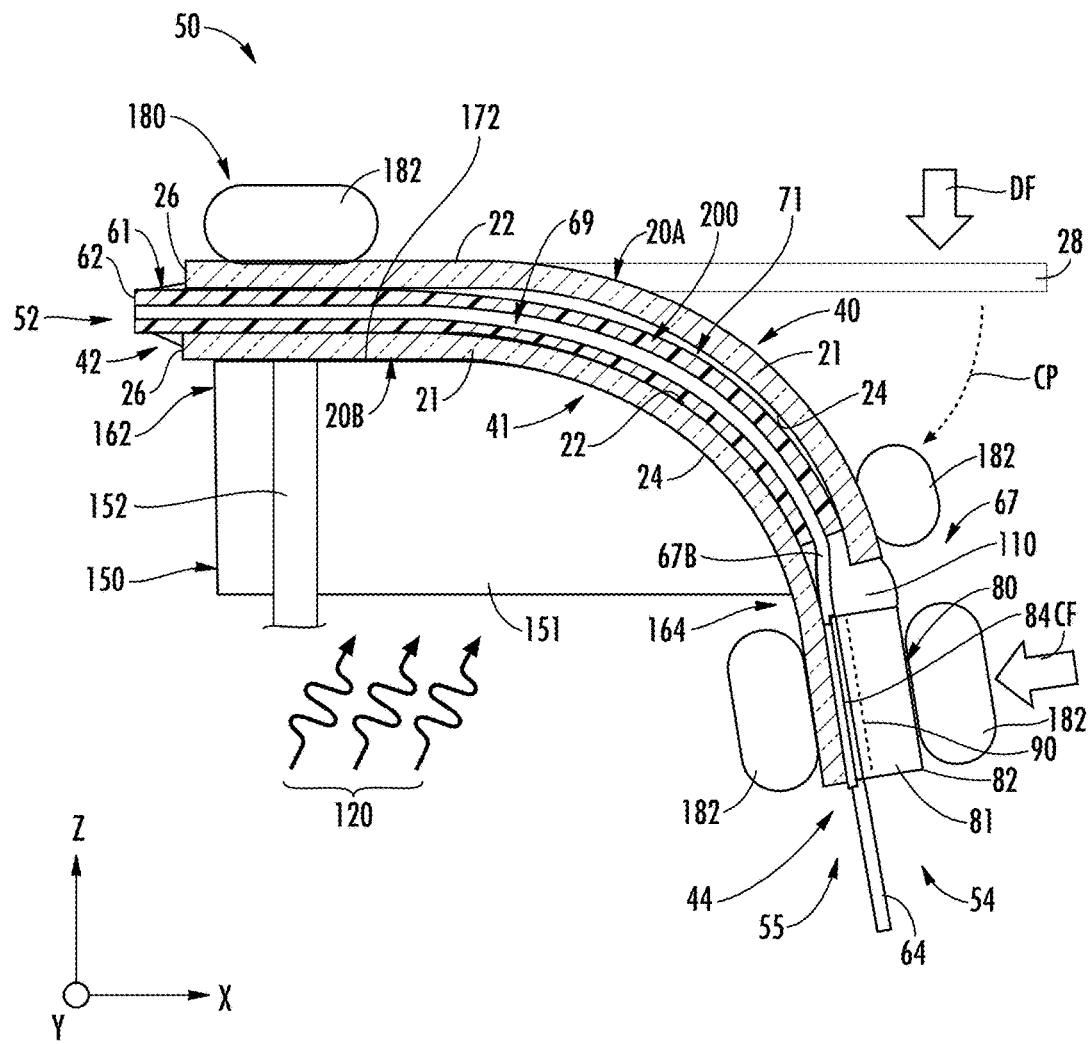

With reference now to FIGS. 8D and 8E, in the next fabrication step, an outer glass sheet 20A is applied to the adhesive layer 110 of the sub-assembly 50 of FIG. 8C. A third clamping apparatus 180 can be employed in a similar manner to the second clamping apparatus 180 to bend the outer glass sheet 20A to conform to the bend section 41 of the existing laminated structure 40. The uncured adhesive 110 is displaced so that the optical fiber array 60 is enclosed by a thin layer of the adhesive. The adhesive 110 is then cured, e.g., by directing activating energy 120 to adhesive 110 through the bending fixture 150.

Figure 9:
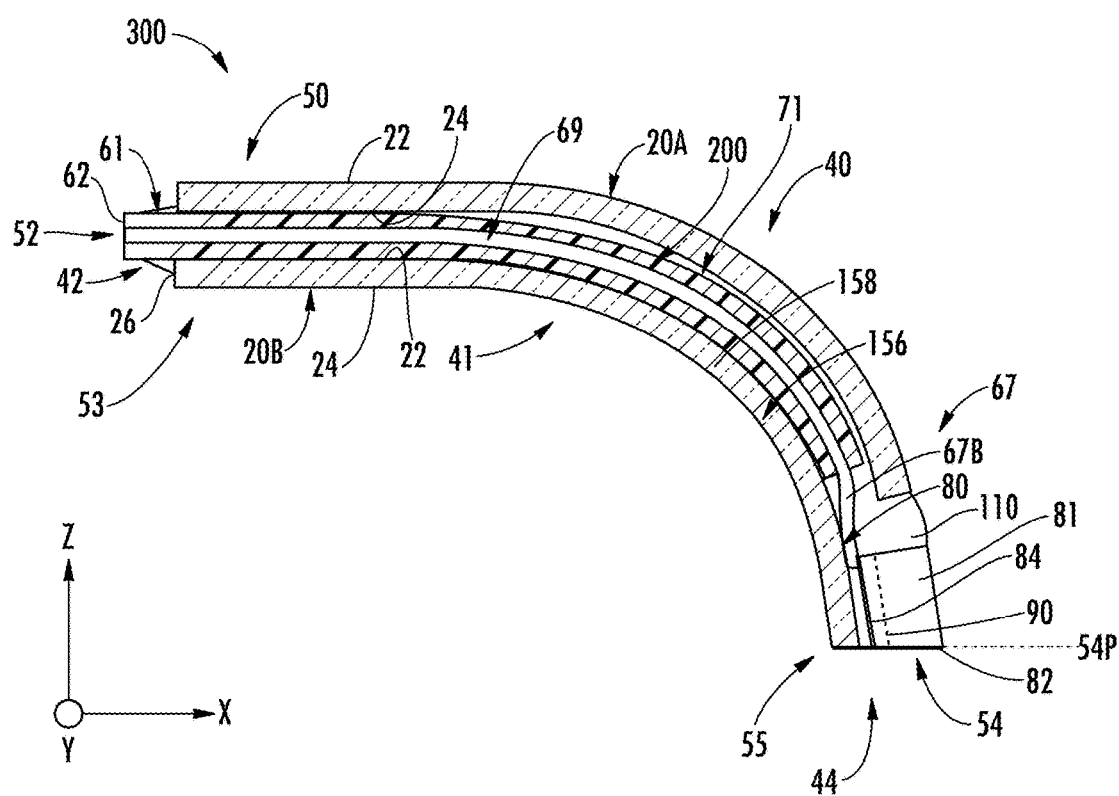
FIG. 9 is the resulting optical interconnection apparatus formed after the bending process performed in FIG. 8E and after processing the back-end section of the sub-assembly.

After curing the adhesive 110, the laminated structure 40 that includes the sandwiched optical fiber array 60 is removed from the bending fixture 150. If the processing of back-end section 55 as described above has not yet been performed, it is then performed at this point to form the optical interconnector 300 as shown in FIG. 9.

If the polished end face area at back-end section 55 is not large enough to provide an adequate area for a robust mechanical bond, then additional support blocks (not shown) can be added to the top or bottom of the existing alignment block 80 to increase the bonding area. This optional aspect of the fabrication process is discussed in greater detail below.

Figure 10A:
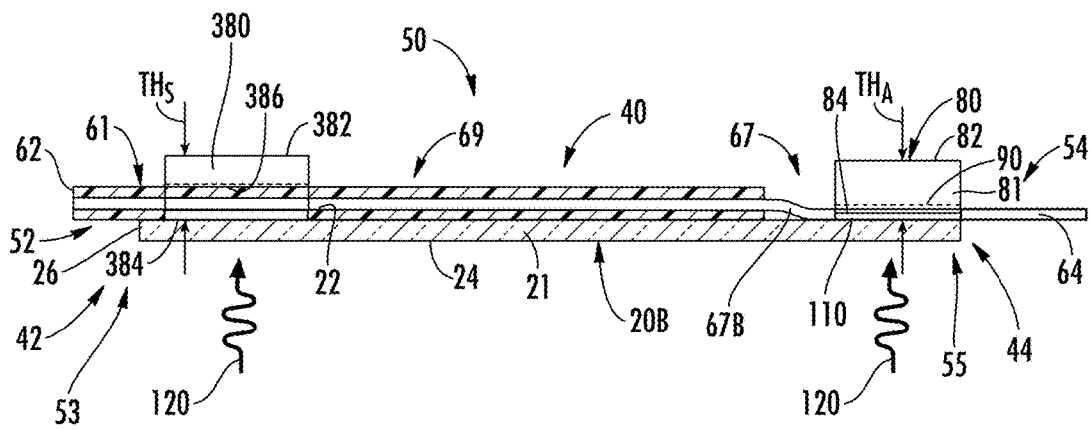
FIG. 10A is similar to FIG. 3A and shows an example sub-assembly disposed on the top surface of an inner glass sheet, with a spacer block disposed in the front-end section of the sub-assembly.

In an alternative embodiment of the fabrication process, the laminated structure 40 with the sandwiched optical fiber array 60 is formed prior to the bending step. FIG. 10A is similar to FIG. 3A and shows an example sub-assembly 50 with the optical fibers 61 of the optical fiber array 60 disposed on the top surface 22 of an inner glass sheet 20B, with an alignment block 80 disposed in the fiber alignment zone 32 as described above. In addition, the sub-assembly 50 includes a spacer block 380 disposed in the front-end section 53 of sub-assembly 50. The spacer block 380 has a top surface 382, a bottom surface 384, and a recess 386 formed in the bottom surface. The spacer block has a thickness $TH_S$ while the thickness of the alignment block is $TH_A$. The spacer block 380 is secured to the top surface 22 of the inner glass sheet 20B near front end 26, with the optical fibers 61 of the optical fiber array 60 running though the recess 386 in the spacer block. In an example, the spacer block 380 is secured to the inner glass sheet 20B using an adhesive 110 that is activated by activation energy 120. The spacer bock 380 is secured to the inner glass sheet 20B such that the optical fibers 61 are free to move beneath the spacer block within recess 386.

Figure 10B:
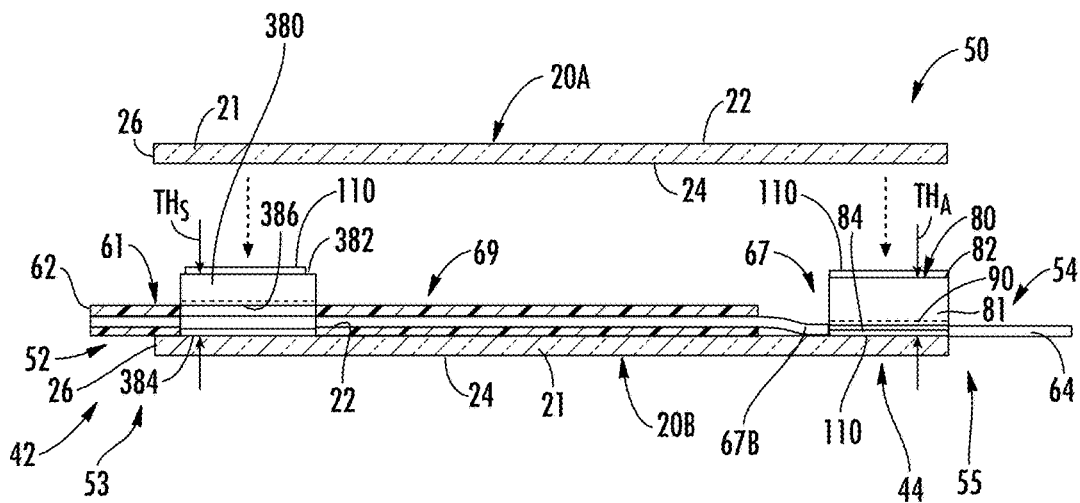
FIGS. 10B and 10C are similar to FIG. 10A and show the addition of an outer glass sheet onto the respective tops of the spacer and alignment blocks.
Figure 10C:
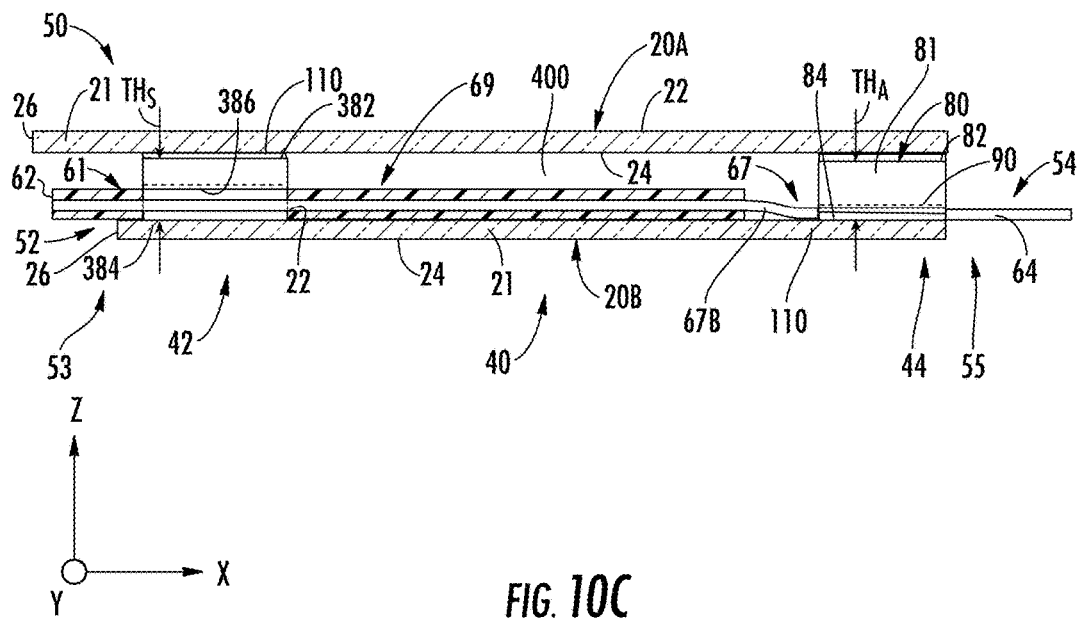

With reference now to FIGS. 10B and 10C, adhesive 110 is applied to the top surface 82 of alignment block 80 and top surface 382 of spacer block 380. An outer glass sheet 20A is then provided and lowered onto sub-assembly 50 so that the lower surface 22 of the outer glass sheet contacts the adhesive 110 residing upon the alignment block 80 and the spacer block 380, thereby forming the sub-assembly 50 shown in FIG. 10C.

Figure 11A:
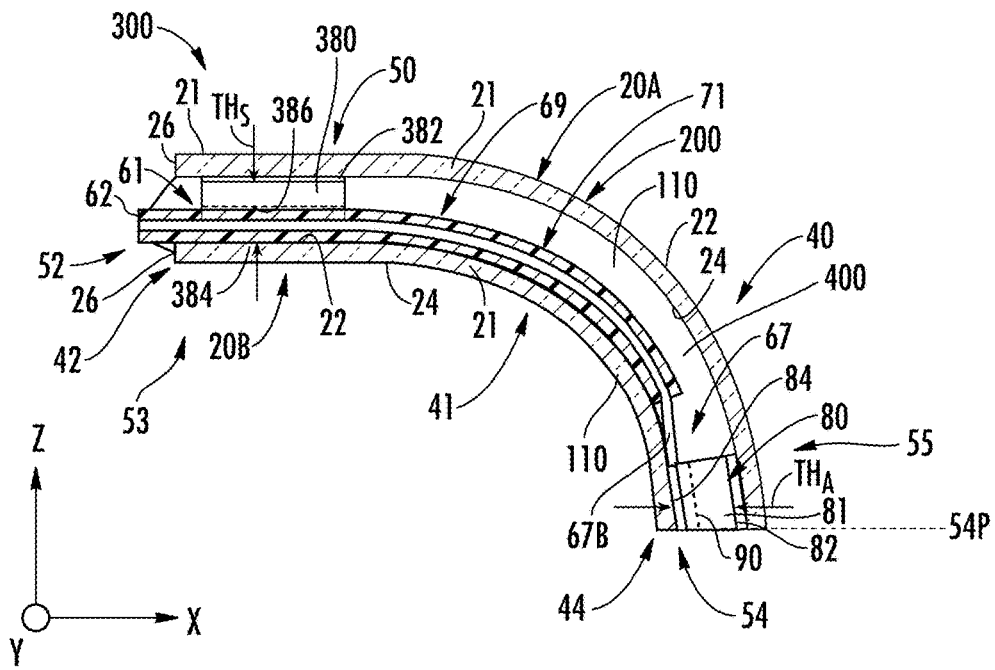
FIG. 11A shows the optical interconnection apparatus formed from the sub-assembly of FIG. 10C by adding an adhesive layer to the cavity between the inner and outer glass sheets and performing bending process and back-end section finishing process.

At this point, the sub-assembly 50 of FIG. 10C is disposed on the bending fixture 150 such as described above in connection with FIG. 8A and the bend section 41 is formed in the sub-assembly. The bend section 41 is then fixed by activating the adhesive 110 in the manner described above in connection with previous embodiments. The back-end section 55 of the sub-assembly 50 is then processed as described above to form the optical interconnector 300 shown in FIG. 11A. The spacer block 380 and the alignment block 80 maintain the outer and inner glass sheets 20A and 20B in a spaced-apart configuration that defines a cavity 400. The cavity 400 can be filled with adhesive 110 before or after the bending operation, but before curing the adhesive.

In an example, the thickness $TH_S$ of the spacer block 380 can be the same as the thickness $TH_A$ of the alignment block 80, such as shown. Since the spacer block 380 adds to the overall height of the laminated structure 40 after assembly, in an example shown in FIG. 11B, the thickness $TH_S$ of the spacer block 380 can be less than the thickness $TH_A$ of the alignment block 80. Thus, the thickness $TH_{LF}$ of the front end 42 of the laminated structure 40 can be made less than the thickness $TH_{LB}$ of the back end 44 of the laminated structure. This provides the laminated structure 40 with a tapered shape that is narrower at the front end 52 of the sub-assembly 50 where spacer block 380 resides. In another example, the thickness $TH_S$ of the spacer block 380 can be selected such that the thickness $TH_{LF}$ of the front end 42 of the laminated structure 40 is substantially the same as the thickness $TH_{LB}$ of the back end 44 of the laminated structure.

Figure 11B:
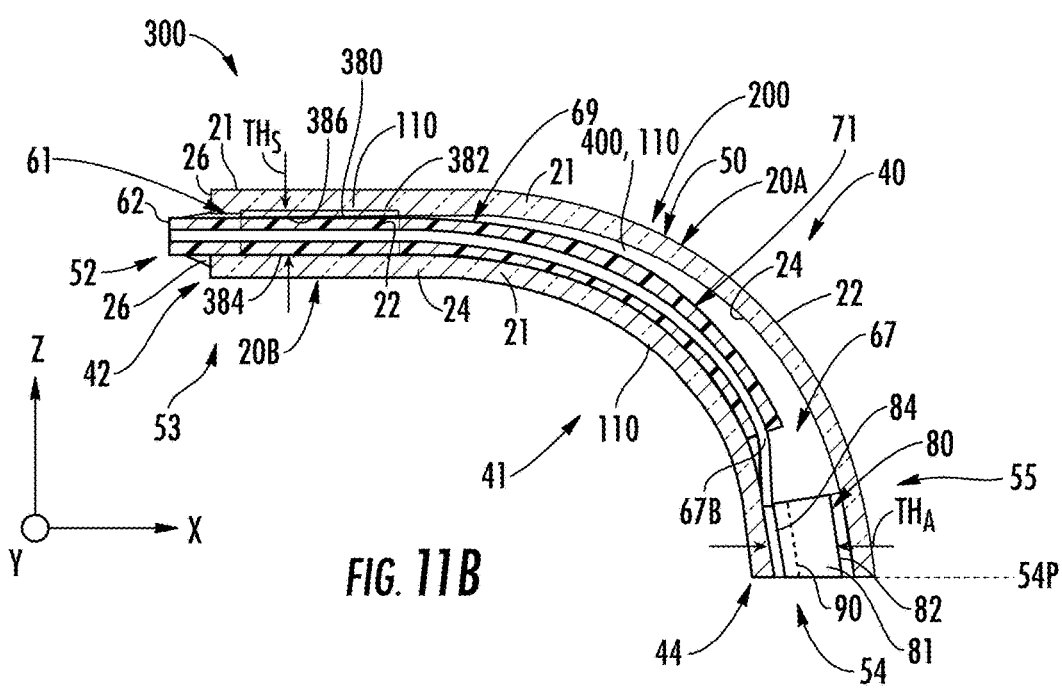
FIG. 11B is similar to FIG. 11A and shows an example where the spacer block is thinner than the alignment block.
Figure 11C:
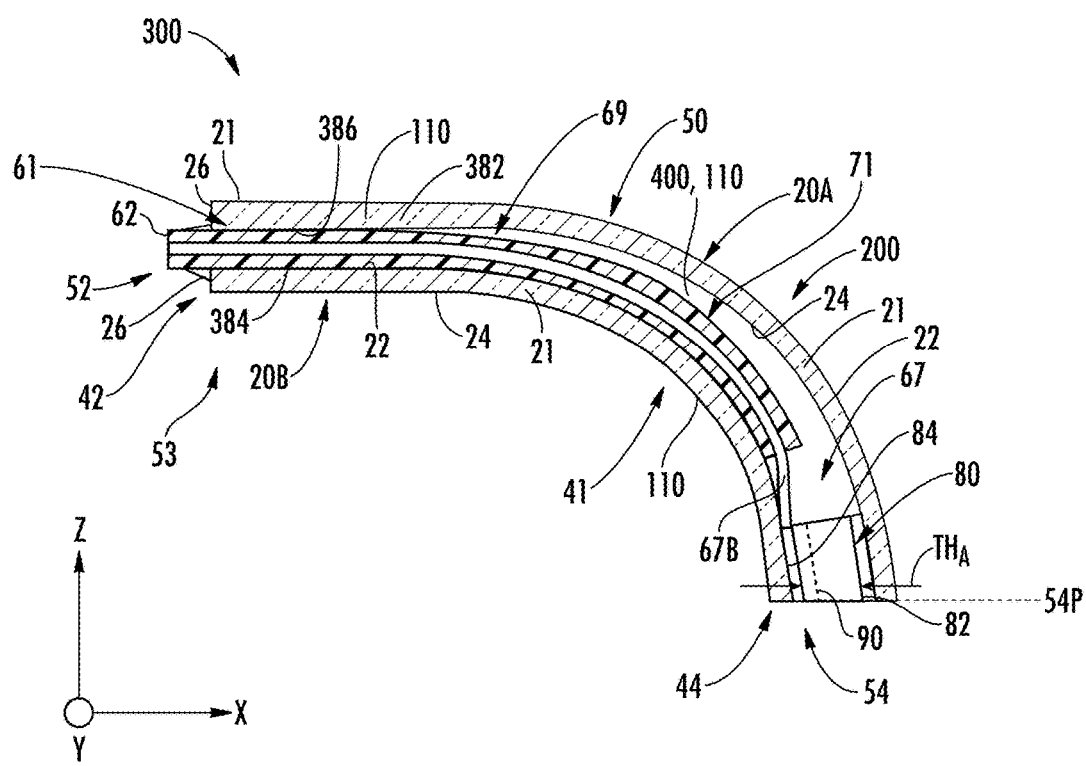
FIG. 11C is similar to FIGS. 11A and 11B and shows an example where the spacer block is absent and the alignment block is used to define the cavity between the inner and outer glass sheets.

FIG. 11C is similar to FIG. 11B and illustrates an example embodiment of optical interconnector 300 wherein no spacer block 380 is used. This can be considered an extreme case of a thin spacer block and it further reduces the overall height of laminated structure 40 at the front end 52 of the sub-assembly 50 while also providing a stronger taper as compared to when the spacer block 380 is employed.

Fabrication Process Using Support Blocks

In some cases, the fabrication process for forming the optical interconnector 300 can benefit from adding a support block on the inside or outside of laminated structure 40 at back-end section 55 to provide sufficient bottom surface bonding area and to avoid joint failure during assembly and subsequent optical fiber pull tests.

Figure 12A:
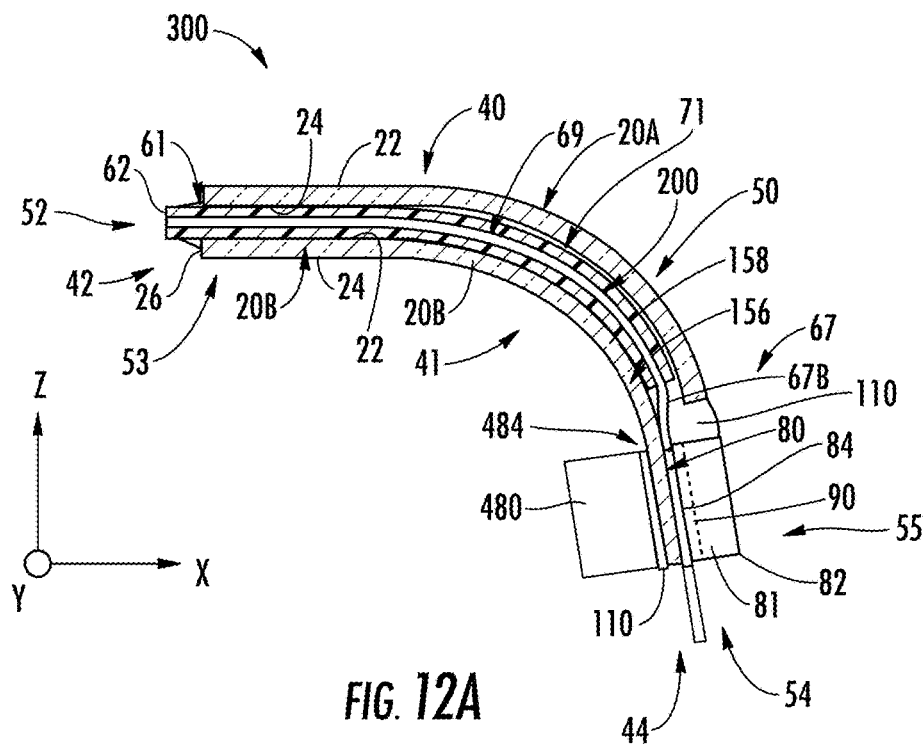
FIG. 12A shows a sub-assembly similar to the optical interconnection apparatus shown in FIG. 9 and that includes a support block disposed on the opposite side of laminated structure as the alignment block.

FIG. 12A shows an example of the sub-assembly 50 similar to that shown in FIG. 9 and that includes a support block 480 disposed on the bottom surface 24 of the inner glass sheet 20B adjacent the back end 28 and thus on the opposite side of the laminated structure 40 as alignment block 80. The addition of the support block 480 on the inside of the bend section 41 has the benefit that stresses induced on the support block during adverse loading conditions are transferred directly to the laminated structure 40. In an example, the support block 480 is secured to laminated structure 40 using adhesive 110.

Figure 12B:
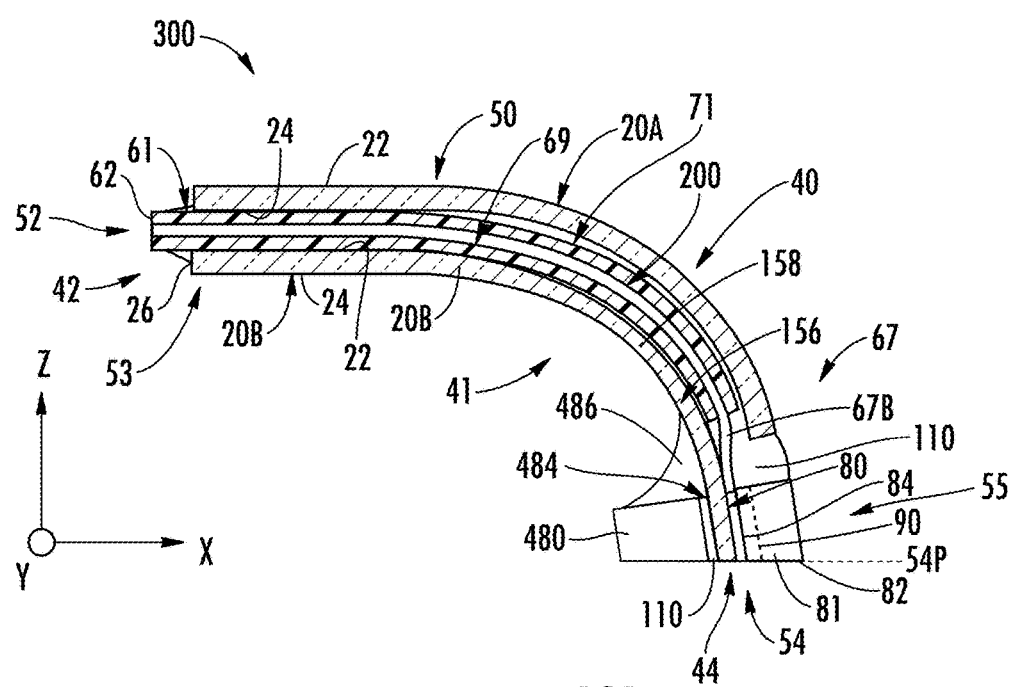
FIG. 12B is similar to FIG. 12A and shows the finished optical interconnection apparatus formed by processing the back-end section of the sub-assembly and adding an adhesive fillet.

After securing the support block 480 to the laminated structure 40, then with reference to FIG. 12B, excess support block material can be removed in the same machining/polishing operation used to remove excess alignment block material and polish the back ends (end faces) 64 of optical fibers 61 to form the optical interconnector 300 shown in FIG. 12B. Additional adhesive 110 may be applied at an interface 484 between the support block 480 and the inner glass sheet 20B to form a fillet 486 that enhances the strength of interface 484.

Figure 13A:
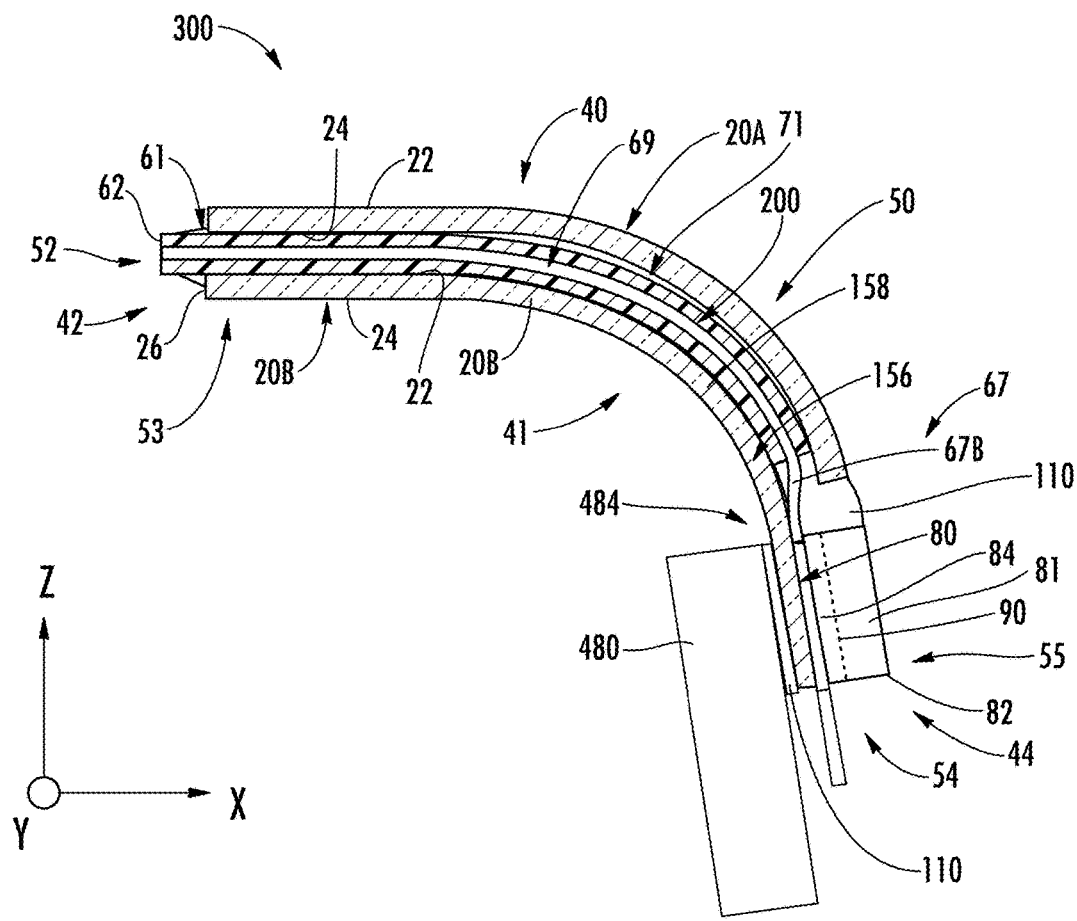
FIG. 13A is similar to FIG. 12A and illustrates an embodiment of the sub-assembly wherein the support block is relatively long so that it extends beyond the back-end section of the sub-assembly.
Figure 13B:
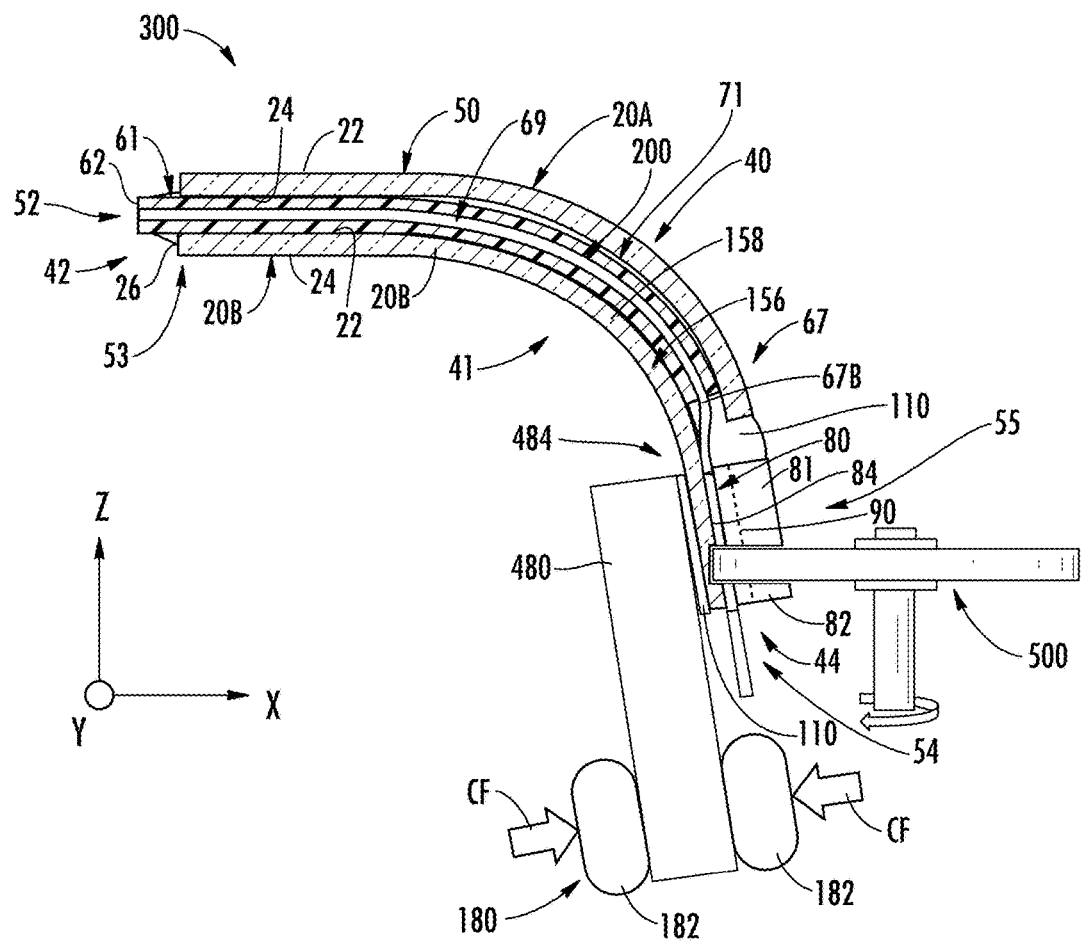
FIG. 13B is similar to FIG. 13A and shows a mechanical cutting device used to process the back-end section of the sub-assembly of FIG. 13A to form the final optical interconnection apparatus.

FIG. 13A is similar to FIG. 12A and illustrates an embodiment of the sub-assembly 50 wherein the support block 480 is relatively long so that it extends beyond the back-end section 55 of the sub-assembly. This allows the support block 480 to serve as a handle for holding the sub-assembly 50 during subsequent fabrication steps. This support capability may be important for limiting stress transferred to the laminated structure 40 during adhesive curing or mechanical cutting/polishing operations with a mechanical cutting device 500 (e.g., a diamond saw), as shown in FIG. 13B. After sawing (i.e., cutting and polishing) and the optional addition of the adhesive 110 to form the fillet 486, the result is the optical interconnector 300 of FIG. 12B.

Modeling Results

Mechanical modeling was performed in the laminated structure 40 to assess whether commercially available adhesives 110 can sustain the shear forces required to hold the glass sheets 20 together in a permanent bend configuration. The modeling was based on simple closed-form expressions for reaction forces in clamped beams and in thin elastic layers, as is known in the art of structural analysis. The modeling was performed for the case where the optical fibers 61 reside outside of the laminated structure 40 and within the adhesive 110 of the laminated structure.

The amount of energy stored in the outer and inner glass sheets 20A and 20B and the sandwiched adhesive layer 100 varies with the bend radius RB of bend section 41. During the curing process, the layers of the laminated structure 40 relax to an equilibrium state where the energy stored is balanced between the inner and outer glass sheets 20A and 20B and the sandwiched adhesive layer 110. During this relaxation, the bending radius RB changes slightly to what is referred to herein as an equilibrium radius $RB_{eq}$. Thus, an optimization operation can be performed to determine the equilibrium radius $RB_{eq}$ (which can be measured to the top surface of the outer glass sheet 20A) where the energy stored in the laminated structure 40 is balanced between the inner and outer glass sheets 20A and 20B and the adhesive layer 100.

Figure 14A:
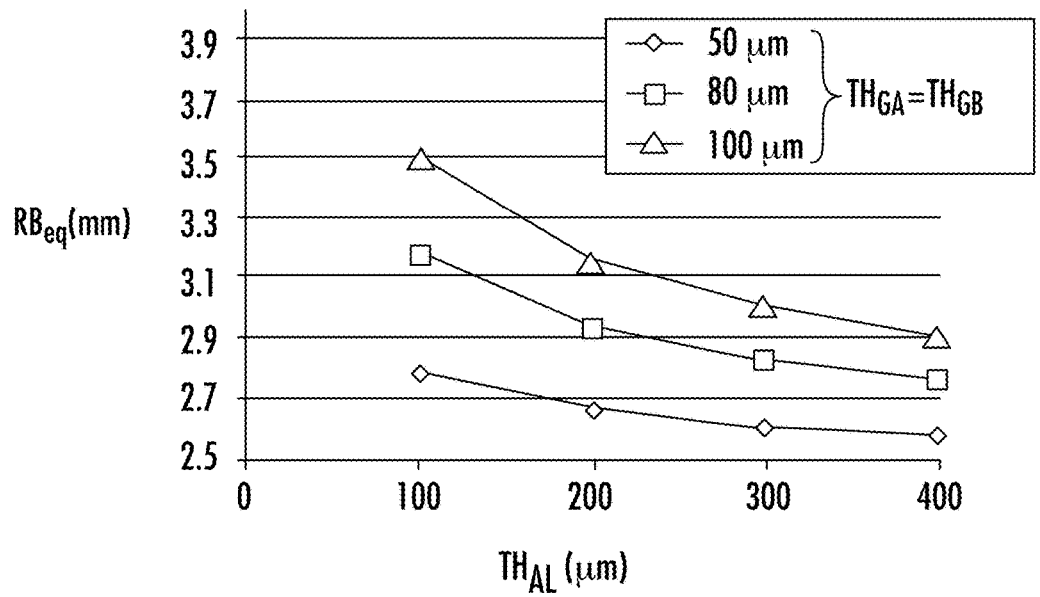
FIG. 14A is a plot of the equilibrium bend radius $R_{eq}$ (mm) after the curing of the adhesive layer versus the thickness $TH_{AL}$ (µm) of the cured adhesive layer for glass thickness $TH_{GA}=TH_{GB}=50$ µm, 80 µm and 100 µm, and an initial bend radius RB of 2.4 mm.

FIG. 14A is a plot of equilibrium bend radius $RB_{eq}$ (mm) after adhesive curing versus the thickness $TH_{AL}$ of the cured adhesive layer 110 (μm) for glass thicknesses $TH_A = TH_B = 50$ μm, 80 μm and 100 μm, and an initial bend radius RB of 2.4 mm. The curves in the plot of FIG. 14A shows that thicker cured adhesive layers 110 are better at preserving the initial bend radius RB than thin layers. This is because thin adhesive layers 110 must be sheared further to store an equivalent amount of energy transferred from the bent glass sheets. It is noted that that the adhesives 110 are being modeled as elastic solids, where even slight shear displacements can produce significant changes in thin glass bend radius.

The curves in the plot of FIG. 14A also indicate that thicker glass sheets 20A and 20B (e.g., 100 μm thick) tend to unbend more than thinner glass sheets (e.g., 50 um thick) on adhesive curing. This result is intuitive, as the thicker glass sheets 20A and 20B will present a larger restoring force than thinner glass sheets, resulting in a larger equilibrium radius. In practice, the observed changed in the bend radius RB to the equilibrium bend radius $RB_{eq}$ upon on adhesive curing can be compensated for by initially bending the thin glass sheets through a smaller radius bend prior to curing so that the final equilibrium bend radius is substantially the same as a desired bend radius RB. The modeling results show that the bend radius RB and the equilibrium bend radius $RB_{eq}$ are practical and well suited for use in low profile optical interconnectors 300.

Figure 14B:
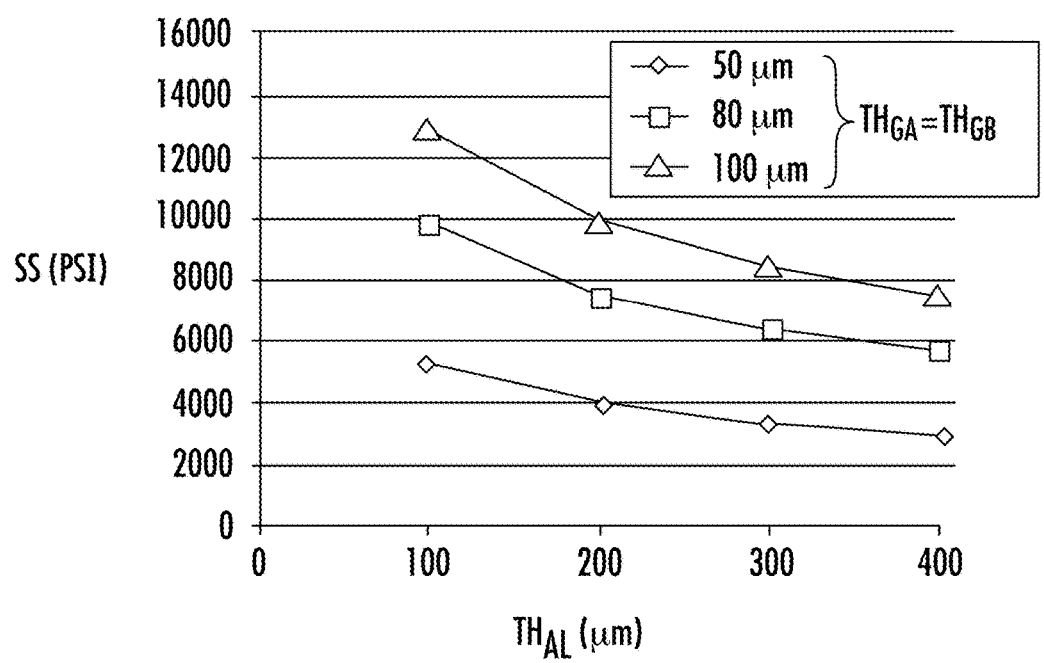
FIG. 14B plots the required shear strength SS (PSI) of the cured adhesive layer of the laminated structure as a function of cured adhesive layer thickness $TH_{AL}$ for glass sheet thicknesses $TH_A=TH_B=50$ µm, 80 µm and 100 µm, and an initial bend radius RB of 2.4 mm.

Since the shear loading displacements are known for the equilibrium condition, the shear forces sustained by the cured adhesive layer 110 at equilibrium can also be calculated. FIG. 14B plots the required shear strength SS (PSI) of the cured adhesive layer 110 as a function of cured adhesive layer thickness $TH_{AL}$ the glass thickness $TH_A = TH_B = 50$ μm, 80 μm and 100 μm, and an initial bend radius RB of 2.4 mm. The curves of the plot of FIG. 14B show that shear strengths SS of >3000 PSI to 5500 PSI are required for implementing laminated structures 40 using thin glass sheets 20A and 20B that each have a thickness $TH_A = TH_B = 50$ μm thick for adhesive layer thicknesses $TH_{AL}$ in the range from 100 μm to 400 μm. Higher shear strengths SS of about 8000 PSI to 13000 PSI are required if the thin glass sheets 20A and 20B are thicker (100 μm thick). The plots also show that the required adhesive shear strength SS decreases as the thickness $TH_A$ of the adhesive layer 110 increases.

Adhesive shear strengths SS of between about 3000 PSI and 4000 PSI are common, while adhesives with shear strengths in excess of 10,000 PSI are also available (e.g., EPO-TEK® TJ1104-LH from Epoxy Technology, Inc., Billerica, Mass., has a reported shear stress of 12,800 PSI).

As discussed above, some embodiments of the laminated structure 40 include the optical fibers 61 within adhesive layer 110. Thus, during assembly of the laminated structure 40, the embedded optical fibers 61 are bent along with the outer and inner glass sheets 20A and 20B, which means that some energy is stored in the bent optical fibers. This energy is partially released along with the stored energy in the outer and inner glass sheets 20A and 20B and transferred into the shear loaded adhesive layer 110 until the equilibrium bend radius $RB_{eq}$ is reached.

The structural modeling of the laminated structure 40 can be extended to this embedded optical fiber configuration by calculating how much thicker the outer and inner thin glass sheets 20A and 20B would need to be to include the contribution of stiffness associated with the embedded optical fibers 61. This can be done by noting that the main contribution to changes in the sheet bending reaction force comes through the moment of inertia term and using the moment of inertia for a round optical fiber.

The modeling results for the laminated structure 40 with the optical fibers 61 embedding in adhesive layer 110 indicate that the presence of the optical fibers does not substantially change the requires shear strength SS of the cured adhesive layer 110.

Generally speaking, for the laminated structures 40 that supports the optical fiber array 60 either externally or internally, commercially available adhesives can provide sufficient shear strength SS as long as thin glass sheets 20 are not excessively thick (e.g., $TH_A$, $TH_B \leq 80$ um), and as long as cured adhesive layers are not excessively thin (e.g., $TH_{AL} \geq 200$ μm). In an example, 30 μm $\leq TH_A$, $TH_B \leq 80$ μm and 200 μm $\leq TH_{AL} \leq 1000$ μm.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. An optical interconnection apparatus, comprising:
   a laminated structure comprising an inner glass sheet, an adhesive layer, and an outer glass sheet, the laminated structure having a first bend section that defines a bend angle of between 80° and 90° and also having an inside surface, an outside surface and front and back opposite ends; and
   at least one optical fiber operably supported by the laminated structure so that the at least one optical fiber has a second bend section that follows the first bend section, wherein the at least one optical fiber has a front end that resides proximate to the front end of the laminated structure and a back end that resides proximate to the back end of the laminated structure.

2. The optical interconnection apparatus according to claim 1, wherein the at least one optical fiber is supported by the outer surface of the laminated structure.

3. The optical interconnection apparatus according to claim 2, further comprising a protective coating disposed over the at least one optical fiber and at least a portion of the outer surface of the laminated structure.

4. The optical interconnection apparatus according to claim 1, wherein the at least one optical fiber is supported by the inner surface of the laminated structure.

5. The optical interconnection apparatus according to claim 4, further comprising a protective coating disposed over the at least one optical fiber and at least a portion of the inner surface of the laminated structure.

6. The optical interconnection apparatus according to claim 1, wherein the at least one optical fiber is supported in the adhesive layer of the laminated structure.

7. The optical interconnection apparatus according to claim 1, wherein the at least one optical fiber comprises a plurality of optical fibers, and further comprising an alignment block having optical fiber alignment features, wherein the alignment block is secured to the laminated structure so that the optical fiber alignment features engage and align the plurality of optical fibers.

8. The optical fiber interconnection apparatus according to claim 7, wherein the optical fiber alignment features comprise parallel V-grooves.

9. The optical fiber interconnection device according to claim 7, wherein each optical fiber includes a bare section that is engaged by the optical fiber alignment features of the alignment block.

10. The optical fiber interconnection device according to claim 7, further comprising a spacer block disposed proximate to the front end of the laminated structure between the inner and outer glass sheets so that the alignment block and the spacer block define a cavity between the inner and outer glass sheets, wherein the plurality of optical fibers reside in the adhesive layer and wherein the adhesive layer fills the cavity.

11. The optical fiber interconnection device according to claim 7, wherein the laminated structure has a first thickness at the front end and a second thickness at the back end, and wherein the first thickness is the same as the second thickness.

12. The optical fiber interconnection device according to claim 7, wherein the laminated structure has a first thickness at the front end and a second thickness at the back end, and wherein the first thickness is less than the second thickness.

13. The optical fiber interconnection device according to claim 1, wherein the first bend section has a bend radius RB in the range 2 mm≤RB≤10 mm.

14. The optical fiber interconnection device according to claim 12, wherein the outer and inner glass sheets have respective thicknesses of $TH_A$ and $TH_B$, wherein the adhesive layer has a thickness $TH_{AL}$, and wherein 30 µm≤$TH_A$, $TH_B$≤80 µm and 200 µm≤$TH_{AL}$≤1000 µm.

15. The optical fiber interconnection device according to claim 1, further comprising a support block secured to the inside surface of the laminated structure proximate to the back end of the laminated structure.

16. The optical fiber interconnection device according to claim 15, further comprising an adhesive fillet between the support block and the inside surface of the laminated structure.

17. The optical fiber interconnection device according to claim 1, wherein the back end of the at least one optical fiber and the back end of the laminated structure reside in a common plane.

18. The optical fiber interconnection device according to claim 1, wherein the front end of the at least one optical fiber extends beyond the front end of the laminated structure.

19. The optical fiber interconnection device according to claim 1, wherein each of the outer and inner glass sheets has a top surface with an outside bend, and wherein at least one of the inner and outer glass sheets has an ion-exchanged region formed in the top surface at the outside bend.

* * * * *